(12) United States Patent
Liao et al.

(10) Patent No.: US 10,386,613 B2
(45) Date of Patent: Aug. 20, 2019

(54) PHOTOGRAPHING OPTICAL LENS ASSEMBLY, IMAGE CAPTURING DEVICE AND ELECTRONIC DEVICE

(71) Applicant: LARGAN PRECISION CO., LTD., Taichung (TW)

(72) Inventors: Lin-Yao Liao, Taichung (TW); Hsin-Hsuan Huang, Taichung (TW)

(73) Assignee: LARGAN PRECISION CO., LTD., Taichung (TW)

( * ) Notice: Subject to any disclaimer, the term of this patent is extended or adjusted under 35 U.S.C. 154(b) by 0 days.

(21) Appl. No.: 16/124,397

(22) Filed: Sep. 7, 2018

(65) Prior Publication Data
US 2019/0004289 A1    Jan. 3, 2019

Related U.S. Application Data

(63) Continuation of application No. 15/375,345, filed on Dec. 12, 2016, now Pat. No. 10,101,562, which is a
(Continued)

(30) Foreign Application Priority Data

Nov. 12, 2014    (TW) .............................. 103139264 A

(51) Int. Cl.
    *G02B 13/00*    (2006.01)
    *G02B 5/00*    (2006.01)
    (Continued)

(52) U.S. Cl.
    CPC ......... *G02B 13/0045* (2013.01); *G02B 5/005* (2013.01); *G02B 5/208* (2013.01);
    (Continued)

(58) Field of Classification Search
    CPC ....... G02B 13/00; G02B 13/0045; G02B 9/60
    (Continued)

(56) References Cited

U.S. PATENT DOCUMENTS

| 3,118,963 A | 1/1964 | Ruben |
| 3,951,524 A | 4/1976 | Doi et al. |

(Continued)

FOREIGN PATENT DOCUMENTS

| CN | 201383031 Y | 1/2010 |
| JP | 58139111 A | 8/1983 |

(Continued)

*Primary Examiner* — Kevin K Pyo
(74) *Attorney, Agent, or Firm* — McClure, Qualey & Rodack, LLP

(57) ABSTRACT

A photographing optical lens assembly includes, in order from an object side to an image side, a first lens element, a second lens element, a third lens element, a fourth lens element and a fifth lens element. The first lens element with positive refractive power has a convex object-side surface. The second lens element with negative refractive power has a convex object-side surface and a concave image-side surface. The third lens element has refractive power. The fourth lens element has refractive power, and an object-side surface and an image-side surface thereof are aspheric. The fifth lens element with negative refractive power has a concave image-side surface, wherein an object-side surface and the image-side surface thereof are aspheric, and at least one of the object-side surface and the image-side surface thereof has at least one inflection point.

29 Claims, 23 Drawing Sheets

Related U.S. Application Data continuation of application No. 14/580,266, filed on Dec. 23, 2014, now Pat. No. 9,606,325.

(51) Int. Cl.
  *G02B 5/20* (2006.01)
  *G02B 9/60* (2006.01)
  *G02B 27/00* (2006.01)
  *H01L 27/146* (2006.01)

(52) U.S. Cl.
  CPC ............ *G02B 9/60* (2013.01); *G02B 27/0025* (2013.01); *H01L 27/14625* (2013.01)

(58) Field of Classification Search
  USPC ............... 250/216, 208.1; 359/714, 363, 754
  See application file for complete search history.

(56) References Cited

U.S. PATENT DOCUMENTS

| | | | |
|---|---|---|---|
| 4,035,063 A | 7/1977 | Ikeda | |
| 4,130,350 A | 12/1978 | Koizumi | |
| 4,530,575 A | 7/1985 | Yamakawa | |
| 4,721,371 A | 1/1988 | Imai | |
| 4,738,496 A | 4/1988 | Canzek | |
| 5,936,775 A | 8/1999 | Abe | |
| 7,710,665 B2 | 5/2010 | Park et al. | |
| 8,395,851 B2 | 3/2013 | Tang et al. | |
| 8,896,936 B2 | 11/2014 | Tsai et al. | |
| 9,958,656 B2 | 5/2018 | Kawamura et al. | |
| 2012/0243109 A1 | 9/2012 | Hsu et al. | |
| 2013/0003195 A1 | 1/2013 | Kubota et al. | |
| 2013/0093942 A1 | 4/2013 | Okano | |
| 2013/0135754 A1 | 5/2013 | Ise et al. | |
| 2014/0204480 A1 | 7/2014 | Jo et al. | |
| 2015/0029601 A1 | 1/2015 | Dror et al. | |
| 2015/0116569 A1 | 4/2015 | Mercado | |
| 2016/0011406 A1 | 1/2016 | Koizumi et al. | |
| 2016/0085056 A1 | 3/2016 | Dror et al. | |
| 2016/0085059 A1 | 3/2016 | Mercado | |
| 2016/0161712 A1 | 6/2016 | Jang et al. | |
| 2017/0146777 A1 | 5/2017 | Dror et al. | |
| 2018/0143406 A1* | 5/2018 | Wenren | G02B 9/62 |
| 2018/0172953 A1* | 6/2018 | Hirose | G02B 13/009 |

FOREIGN PATENT DOCUMENTS

| | | |
|---|---|---|
| JP | H02-167516 A | 6/1990 |
| JP | H04321006 A | 11/1992 |
| JP | 06222260 A | 8/1994 |
| JP | 1997-068651 | 11/1997 |
| JP | 11072720 A | 3/1999 |
| JP | H11133315 A | 5/1999 |
| JP | 2010-145648 A | 7/2010 |
| JP | 2010262269 A | 11/2010 |
| JP | 2013-161019 A | 8/2013 |
| JP | 2013156457 A | 8/2013 |
| JP | 2014142665 A | 8/2014 |
| KR | 10-0407422 | 11/2003 |
| TW | I565968 B | 1/2017 |
| WO | 2014-155465 A1 | 10/2014 |

\* cited by examiner

PHOTOGRAPHING OPTICAL LENS ASSEMBLY, IMAGE CAPTURING DEVICE AND ELECTRONIC DEVICE

RELATED APPLICATIONS

The present application is a continuation of the application Ser. No. 15/375,345, filed Dec. 12, 2016, which is a continuation of the application Ser. No. 14/580,266, filed Dec. 23, 2014, now U.S. Pat. No. 9,606,325 issued on Mar. 28, 2017, which claims priority to Taiwan Application Serial Number 103139264, filed Nov. 12, 2014, which is herein incorporated by reference.

BACKGROUND

Technical Field

The present disclosure relates to a photographing optical lens assembly. More particularly, the present disclosure relates to a compact photographing optical lens assembly applicable to electronic devices.

Description of Related Art

In recent years, with the popularity of electronic devices having camera functionalities, the demand of miniaturized optical systems has been increasing. The sensor of a conventional optical system is typically a CCD (Charge-Coupled Device) or a CMOS (Complementary Metal-Oxide-Semiconductor) sensor. As the advanced semiconductor manufacturing technologies have allowed the pixel size of sensors to be reduced and compact optical systems have gradually evolved toward the field of higher megapixels, there is an increasing demand for compact optical systems featuring better image quality.

A conventional optical system employed in a portable electronic product mainly adopts a three-element lens structure or a four-element lens structure. Due to the popularity of mobile terminals with high-end specifications, such as smart phones, tablet personal computers and wearable apparatus, the requirements for high resolution image quality of present compact optical systems increase significantly. However, the conventional optical systems cannot satisfy these requirements of the compact optical systems.

Other conventional compact optical systems with five-element lens structure are disclosed. However, the refractive power and the surface shape of the lens elements are not favorable for forming a telephoto structure and providing the first lens element (which is the lens element closet to an object side of the optical system) with sufficient light converging ability. Furthermore, the focal lengths of the lens elements and axial distances between the lens elements are not favorable for providing sufficient space for controlling optical paths of the light rays entering into the optical system while controlling the refractive power of the first lens element. As a result, a long-shot scene cannot be clearly imaged on an image surface of the optical system, and the image quality is poor.

SUMMARY

According to one aspect of the present disclosure, a photographing optical lens assembly includes, in order from an object side to an image side, a first lens element, a second lens element, a third lens element, a fourth lens element and a fifth lens element. The first lens element with positive refractive power has a convex object-side surface. The second lens element with negative refractive power has a convex object-side surface and a concave image-side surface. The third lens element has refractive power. The fourth lens element has refractive power, wherein an object-side surface and an image-side surface of the fourth lens element are aspheric. The fifth lens element with negative refractive power has a concave image-side surface, wherein an object-side surface and the image-side surface of the fifth lens element are aspheric, and at least one of the object-side surface and the image-side surface of the fifth lens element has at least one inflection point. The photographing optical lens assembly has a total of five lens elements with refractive power. No relative movement is between any two of the first lens element, the second lens element, the third lens element, the fourth lens element and the fifth lens element. The photographing optical lens assembly further includes a stop. When a focal length of the photographing optical lens assembly is f, a focal length of the first lens element is f1, an axial distance between the third lens element and the fourth lens element is T34, a maximum image height of the photographing optical lens assembly is ImgH, an axial distance between the stop and the image-side surface of the fifth lens element is SD, and an axial distance between the object-side surface of the first lens element and the image-side surface of the fifth lens element is TD, the following relationships are satisfied:

$$0 < f1/T34 < 4.0;$$

$$2.00 < f/ImgH; \text{ and}$$

$$0.75 < SD/TD < 1.2.$$

According to another aspect of the present disclosure, an image capturing device includes the aforementioned photographing optical lens assembly and an image sensor. The image sensor is disposed on the image side of the photographing optical lens assembly.

According to yet another aspect of the present disclosure, an electronic device includes the aforementioned image capturing device.

According to further another aspect of the present disclosure, a photographing optical lens assembly includes, in order from an object side to an image side, a first lens element, a second lens element, a third lens element, a fourth lens element and a fifth lens element. The first lens element with positive refractive power has a convex object-side surface. The second lens element with refractive power has a concave image-side surface. The third lens element with refractive power has a concave object-side surface. The fourth lens element has refractive power, wherein an object-side surface and an image-side surface of the fourth lens element are aspheric. The fifth lens element has refractive power, wherein an object-side surface and an image-side surface of the fifth lens element are aspheric, and at least one of the object-side surface and the image-side surface of the fifth lens element has at least one inflection point. The photographing optical lens assembly has a total of five lens elements with refractive power. No relative movement is between any two of the first lens element, the second lens element, the third lens element, the fourth lens element and the fifth lens element. The photographing optical lens assembly further includes a stop. When a focal length of the photographing optical lens assembly is f, a focal length of the first lens element is f1, an axial distance between the third lens element and the fourth lens element is T34, a maximum image height of the photographing optical lens assembly is ImgH, an axial distance between the stop and the image-side surface of the fifth lens element is SD, and an axial distance between the object-side surface of the first lens element and the image-side surface of the fifth lens element is TD, the following relationships are satisfied:

$0<f1/T34<4.0$;

$2.00<f/ImgH$; and $0.75<SD/TD<1.2$.

According to further another aspect of the present disclosure, a photographing optical lens assembly includes, in order from an object side to an image side, a first lens element, a second lens element, a third lens element, a fourth lens element and a fifth lens element. The first lens element with positive refractive power has a convex object-side surface. The second lens element with refractive power has a concave image-side surface. The third lens element has refractive power. The fourth lens element with refractive power has a convex image-side surface, wherein an object-side surface and the image-side surface of the fourth lens element are aspheric. The fifth lens element has negative refractive power, wherein an object-side surface and an image-side surface of the fifth lens element are aspheric, and at least one of the object-side surface and the image-side surface of the fifth lens element has at least one inflection point. The photographing optical lens assembly has a total of five lens elements with refractive power. No relative movement is between any two of the first lens element, the second lens element, the third lens element, the fourth lens element and the fifth lens element. The photographing optical lens assembly further includes a stop. When a focal length of the photographing optical lens assembly is f, a focal length of the first lens element is f1, an axial distance between the third lens element and the fourth lens element is T34, a maximum image height of the photographing optical lens assembly is ImgH, an axial distance between the stop and the image-side surface of the fifth lens element is SD, an axial distance between the object-side surface of the first lens element and the image-side surface of the fifth lens element is TD, a curvature radius of the object-side surface of the fifth lens element is R9, and a curvature radius of the image-side surface of the fifth lens element is R10, the following relationships are satisfied:

$0<f1/T34<4.0$;

$2.00<f/ImgH$;

$0.75<SD/TD<1.2$; and $|R10/R9|<3$.

According to further another aspect of the present disclosure, a photographing optical lens assembly includes, in order from an object side to an image side, a first lens element, a second lens element, a third lens element, a fourth lens element and a fifth lens element. The first lens element with positive refractive power has a convex object-side surface. The second lens element with refractive power has a concave image-side surface. The third lens element has negative refractive power. The fourth lens element has refractive power, wherein an object-side surface and an image-side surface of the fourth lens element are aspheric. The fifth lens element has negative refractive power, wherein an object-side surface and an image-side surface of the fifth lens element are aspheric, and at least one of the object-side surface and the image-side surface of the fifth lens element has at least one inflection point. The photographing optical lens assembly has a total of five lens elements with refractive power. No relative movement is between any two of the first lens element, the second lens element, the third lens element, the fourth lens element and the fifth lens element. The photographing optical lens assembly further includes a stop. When a focal length of the photographing optical lens assembly is f, a focal length of the first lens element is f1, an axial distance between the third lens element and the fourth lens element is T34, a maximum image height of the photographing optical lens assembly is ImgH, an axial distance between the stop and the image-side surface of the fifth lens element is SD, an axial distance between the object-side surface of the first lens element and the image-side surface of the fifth lens element is TD, a curvature radius of the object-side surface of the fifth lens element is R9, and a curvature radius of the image-side surface of the fifth lens element is R10, the following relationships are satisfied:

$0<f1/T34<4.0$;

$2.00<f/ImgH$;

$0.75<SD/TD<1.2$; and $|R10/R9|<3$.

According to further another aspect of the present disclosure, a photographing optical lens assembly includes, in order from an object side to an image side, a first lens element, a second lens element, a third lens element, a fourth lens element and a fifth lens element. The first lens element with positive refractive power has a convex object-side surface. The second lens element has negative refractive power. The third lens element with refractive power has a concave object-side surface. The fourth lens element has refractive power, wherein an object-side surface and an image-side surface of the fourth lens element are aspheric. The fifth lens element has refractive power, wherein an object-side surface and an image-side surface of the fifth lens element are aspheric, and at least one of the object-side surface and the image-side surface of the fifth lens element has at least one inflection point. The photographing optical lens assembly has a total of five lens elements with refractive power. No relative movement is between any two of the first lens element, the second lens element, the third lens element, the fourth lens element and the fifth lens element. An axial distance is between any two of the first lens element, the second lens element, the third lens element, the fourth lens element and the fifth lens element adjacent to each other. The photographing optical lens assembly further includes a stop. When a focal length of the first lens element is f1, an axial distance between the third lens element and the fourth lens element is T34, an axial distance between the stop and the image-side surface of the fifth lens element is SD, and an axial distance between the object-side surface of the first lens element and the image-side surface of the fifth lens element is TD, the following relationships are satisfied:

$0<f1/T34<2.85$; and $0.75<SD/TD<1.2$.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
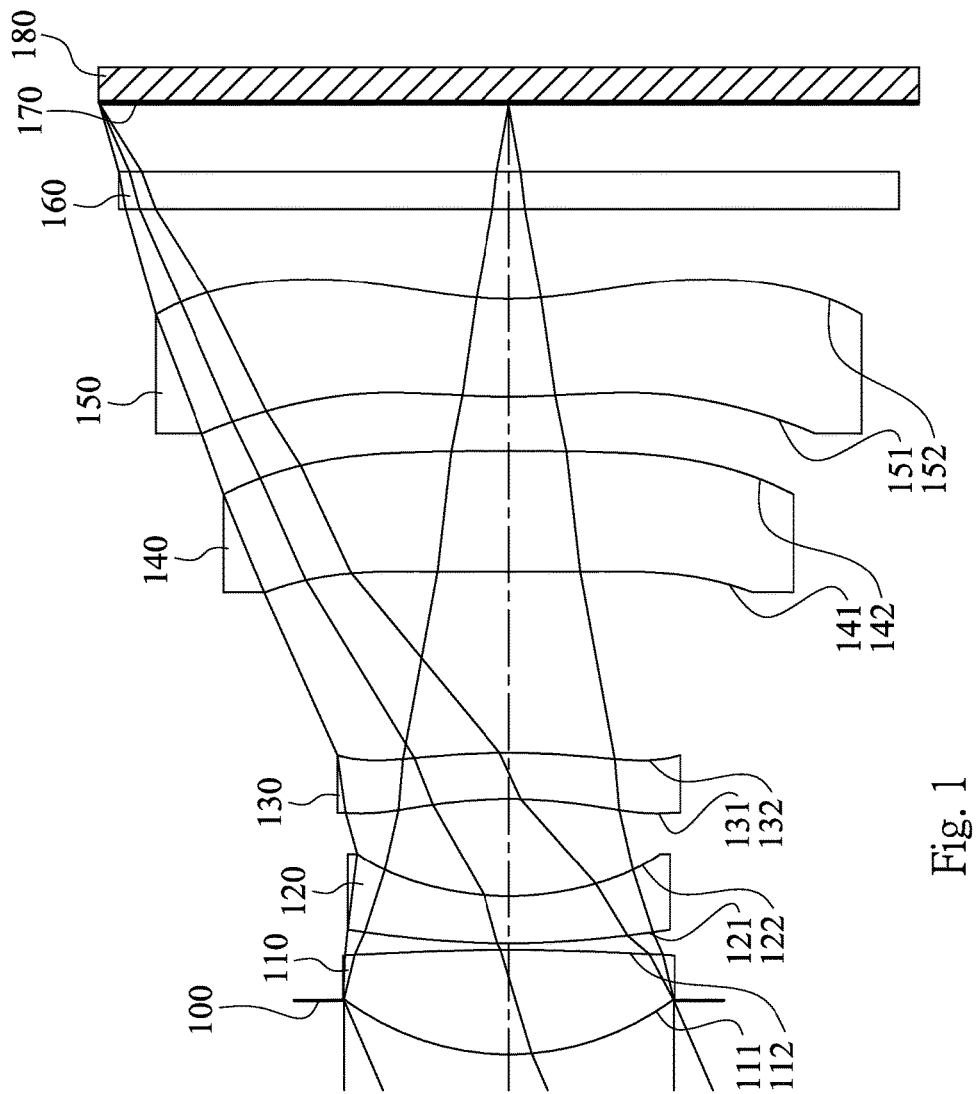
FIG. 1 is a schematic view of an image capturing device according to the 1st embodiment of the present disclosure.

A photographing optical lens assembly includes, in order from an object side to an image side, a first lens element, a second lens element, a third lens element, a fourth lens element and a fifth lens element. The photographing optical lens assembly has a total of five lens elements with refractive power. No relative movement is between any two of the first lens element, the second lens element, the third lens element, the fourth lens element and the fifth lens element. That is, the photographing optical lens assembly is a fixed-focus optical system, and an axial distance between any two of the first lens element, the second lens element, the third lens element, the fourth lens element and the fifth lens element adjacent to each other is fixed.

An axial distance is between any two of the first lens element, the second lens element, the third lens element, the fourth lens element and the fifth lens element adjacent to each other. That is, each of the first lens element, the second lens element, the third lens element, the fourth lens element and the fifth lens element is a single and non-cemented lens element. Moreover, the manufacturing process of the cemented lens elements is more complex than the non-cemented lens elements. In particular, a second surface of one lens element and a first surface of the following lens element need to have accurate curvature to ensure these two lens elements will be highly cemented. However, during the cementing process, those two lens elements might not be highly cemented due to displacement and it is thereby not favorable for the image quality of the photographing optical lens assembly. Therefore, the photographing optical lens assembly of the present disclosure provides five single and non-cemented lens elements for avoiding the problem generated by the cemented lens elements.

The first lens element with positive refractive power has a convex object-side surface, and can have a convex image-side surface. Therefore, the light converging ability of the first lens element can be enhanced, and the total track length of the photographing optical lens assembly can be reduced.

The second lens element can have negative refractive power, and can have a convex object-side surface and a concave image-side surface. Therefore, the aberration of the photographing optical lens assembly can be effectively corrected so as to improve the image quality.

The third lens element can have negative refractive power, and can have a concave object-side surface and a convex image-side surface. Therefore, the astigmatism of the photographing optical lens assembly can be effectively corrected so as to improve the image quality. Furthermore, at least one of the object-side surface and the image-side surface of the third lens element can have at least one inflection point. Therefore, the aberration of the off-axis field can be corrected.

The fourth lens element can have positive refractive power, and can have a convex image-side surface. Therefore, the distribution of the positive refractive power of the photographing optical lens assembly can be balanced so as to reduce the photosensitivity thereof.

The fifth lens element can have negative refractive power, and can have a convex object-side surface and a concave image-side surface. Therefore, the astigmatism of the photographing optical lens assembly can be effectively corrected so as to improve the image quality. Furthermore, at least one of the object-side surface and the image-side surface of the fifth lens element has at least one inflection point. Therefore, the aberration of the off-axis field can be corrected, so that the high image quality can be obtained.

When a focal length of the first lens element is f1, and an axial distance between the third lens element and the fourth lens element is T34, the following relationship is satisfied: $0 < f1/T34 < 4.0$. Therefore, the axial distance between the third lens element and the fourth lens element can be adjusted for providing sufficient space for controlling optical paths of the light rays entering into the photographing optical lens assembly while controlling the refractive power of the first lens element. Thus the image quality of the long-shot can be improved. Preferably, the following relationship can be satisfied: $0<f1/T34<3.30$. More preferably, the following relationship can be satisfied: $0<f1/T34<2.85$.

When a focal length of the photographing optical lens assembly is f, and a maximum image height of the photographing optical lens assembly is ImgH, the following relationship can be satisfied: $2.00<f/ImgH$. Therefore, the photographing range can be favorably controlled for clearly imaging a distance scene on an image surface of the photographing optical lens assembly.

The photographing optical lens assembly can further includes a stop, such as an aperture stop. When an axial distance between the stop and the image-side surface of the fifth lens element is SD, and an axial distance between the object-side surface of the first lens element and the image-side surface of the fifth lens element is TD, the following relationship is satisfied: $0.75<SD/TD<1.2$. Therefore, the telecentricity and the wide-angle character of the photographing optical lens assembly can be balanced. Preferably, the following relationship can be satisfied: $0.85<SD/TD<1.0$.

When a curvature radius of the object-side surface of the fifth lens element is R9, and a curvature radius of the image-side surface of the fifth lens element is R10, the following relationship can be satisfied: $|R10/R9|<3$. Therefore, the surface curvatures of the fifth lens element are proper for correcting the astigmatism and the distortion of the photographing optical lens assembly, and the incident angle of the light rays onto an image sensor can be effectively reduced. Accordingly, the photosensitivity of the photographing optical lens assembly can be improved, and the brightness or saturation at the periphery of the image can be maintained. Preferably, the following relationship can be satisfied: $|R10/R9|<0.9$.

When an axial distance between the first lens element and the second lens element is T12, an axial distance between the second lens element and the third lens element is T23, the axial distance between the third lens element and the fourth lens element is T34, and an axial distance between the fourth lens element and the fifth lens element is T45, T34 is greater than T12, T23 and T45. Therefore, the axial distance between the third lens element and the fourth lens element can be adjusted for providing sufficient space for controlling the optical paths of the light rays entering into the photographing optical lens assembly.

When an Abbe number of the second lens element is V2, and an Abbe number of the fourth lens element is V4, the following relationship can be satisfied: $20<V2+V4<65$. Therefore, the chromatic aberration of the photographing optical lens assembly can be corrected.

When the focal length of the photographing optical lens assembly is f, the focal length of the first lens element is f1, and a focal length of the second lens element is f2, the following relationship can be satisfied: $3.0<|f/f1|+|f/f2|$. Therefore, the image quality of the long-shot of the photographing optical lens assembly can be improved.

When a composite focal length of the first lens element and the second lens element is f12, and a composite focal length of the third lens element, the fourth lens element and the fifth lens element is f345, the following relationship can be satisfied: $-0.80<f12/f345<-0.40$. Therefore, it is favorable for forming a telephoto optical system having positive refractive near the object side and negative refractive near the image side, and a long-shot scene can be clearly imaged on the image surface.

When the axial distance between the first lens element and the second lens element is T12, the axial distance between the second lens element and the third lens element is T23, the axial distance between the third lens element and the fourth lens element is T34, and the axial distance between the fourth lens element and the fifth lens element is T45, the following relationship can be satisfied: $0<T12<T45<T23<T34$. Therefore, the axial distances between the lens elements can be adjusted for providing sufficient space for controlling the optical paths of the light rays entering into the photographing optical lens assembly. Furthermore, it is favorable for assembling the lens elements.

When a half of a maximal field of view of the photographing optical lens assembly is HFOV, the following relationship can be satisfied: $HFOV<25$ degrees. Therefore, the photographing range can be favorably controlled for improving the image quality of the long-shot.

When the focal length of the photographing optical lens assembly is f, and an entrance pupil diameter of the photographing optical lens assembly is EPD, the following relationship can be satisfied: $2.4<f/EPD<3.5$. Therefore, the size of the stop can be favorably controlled for the light rays entering into the photographing optical lens assembly while improving the image quality of the long-shot.

When a curvature radius of the image-side surface of the second lens element is R4, a curvature radius of the image-side surface of the fourth lens element is R8, the curvature radius of the object-side surface of the fifth lens element is R9, and the curvature radius of the image-side surface of the fifth lens element is R10, the following relationships are satisfied: $|R4|<|R8|$; $|R4|<|R9|$; and $|R4|<|R10|$. Therefore, the astigmatism of the photographing optical lens assembly can be effectively corrected so as to improve the image quality.

The refractive power of the fifth lens element can decrease from a paraxial region to an off-axis region thereof. (The result is obtained from comparing the absolute values of the refractive power of the fifth lens element at different positions. When the refractive power is stronger, the absolute value of the refractive power is larger. Similarly, when the refractive power is weaker, the absolute value of the refractive power is smaller.) Therefore, the refractive degree of the incident light rays can be minimized, and the aberration can be reduced. Accordingly, the image quality at the periphery of the image can be improved.

When the focal length of the photographing optical lens assembly is f, the focal length of the first lens element is f1, the focal length of the second lens element is f2, a focal length of the third lens element is f3, a focal length of the fourth lens element is f4, and a focal length of the fifth lens element is f5, the following relationships are satisfied: $|f/f1|>|f/f2|>|f/f5|>|f/f3|$; and $|f/f1|>|f/f2|>|f/f5|>|f/f4|$. Therefore, the light converging ability of the first lens element can be enhanced. Accordingly, the total track length of the photographing optical lens assembly can be reduced, and the image quality of the long-shot can be improved.

When an axial distance between the object-side surface of the first lens element and the image surface is TL, and the maximum image height of the photographing optical lens assembly is ImgH, the following relationship can be satisfied: $2.0<TL/ImgH<3.0$. Therefore, the compact size of the photographing optical lens assembly can be maintained for applying to thin and portable electronics.

The refractive power of the first lens element is stronger than the refractive power of the second lens element, the third lens element, the fourth lens element and the fifth lens element. (The result is obtained from comparing the absolute values of the refractive power of the lens elements.

When the refractive power is stronger, the absolute value of the refractive power is larger. Similarly, when the refractive power is weaker, the absolute value of the refractive power is smaller.) Therefore, the light converging ability of the first lens element can be enhanced, and the total track length of the photographing optical lens assembly can be reduced.

According to the photographing optical lens assembly of the present disclosure, the lens elements thereof can be made of glass or plastic material. When the lens elements are made of glass material, the distribution of the refractive powers of the photographing optical lens assembly may be more flexible to design. When the lens elements are made of plastic material, the manufacturing cost can be effectively reduced. Furthermore, surfaces of each lens element can be arranged to be aspheric, since the aspheric surface of the lens element is easy to form a shape other than spherical surface so as to have more controllable variables for eliminating the aberration thereof, and to further decrease the required number of the lens elements. Therefore, the total track length of the photographing optical lens assembly can also be reduced.

According to the photographing optical lens assembly of the present disclosure, each of an object-side surface and an image-side surface has a paraxial region and an off-axis region. The paraxial region refers to the region of the surface where light rays travel close to the optical axis, and the off-axis region refers to the region of the surface away from the paraxial region. Particularly, if not stated otherwise, when the lens element has a convex surface, it indicates that the surface is convex in the paraxial region thereof, when the lens element has a concave surface, it indicates that the surface is concave in the paraxial region thereof. Furthermore, if not stated otherwise, the refractive power or the focal length of the lens element, that is, refers to the refractive power or the focal length in a paraxial region of the lens element.

According to the photographing optical lens assembly of the present disclosure, an image surface of the photographing optical lens assembly, based on the corresponding image sensor, can be flat or curved. For instance, the image surface can be a curved surface being concave facing towards the object side.

According to the photographing optical lens assembly of the present disclosure, the photographing optical lens assembly can include at least one stop, such as an aperture stop, a glare stop or a field stop. Said glare stop or said field stop is for eliminating the stray light and thereby improving the image resolution thereof.

According to the photographing optical lens assembly of the present disclosure, an aperture stop can be configured as a front stop or a middle stop. A front stop disposed between an imaged object and the first lens element can provide a longer distance between an exit pupil of the photographing optical lens assembly and the image surface and thereby improves the image-sensing efficiency of an image sensor. A middle stop disposed between the first lens element and the image surface is favorable for enlarging the field of view of the photographing optical lens assembly and thereby provides a wider field of view for the same.

The photographing optical lens assembly of the present disclosure also can be applied to 3D (three-dimensional) image capturing applications, in products such as digital cameras, mobile devices, digital tablets, smart TV, internet monitoring device, game consoles with motion sensing function, driving recording systems, rear view camera systems, and wearable devices.

According to the present disclosure, an image capturing device is provided. The image capturing device includes the aforementioned photographing optical lens assembly and an image sensor. The image sensor is disposed on the image side of the photographing optical lens assembly, that is, the image sensor can be disposed on or near the image surface of the aforementioned photographing optical lens assembly. The first lens element of the photographing optical lens assembly has positive refractive power, which is favorable for forming a telephoto optical system having positive refractive power near the object side and negative refractive power near the image side. The first lens element has the convex object-side surface, so that the light converging ability of the first lens element can be enhanced. Moreover, the axial distance between the third lens element and the fourth lens element can be adjusted for providing sufficient space for controlling optical paths of the light rays entering into the photographing optical lens assembly while controlling the refractive power of the first lens element. As a result, the image quality of the long-shot can be improved. Furthermore, the focal length of the photographing optical lens assembly and the maximum image height of the photographing optical lens assembly can be adjusted, so that the photographing range can be controlled for dearly imaging a distance scene on the image surface of the photographing optical lens assembly. Preferably, the image capturing device can further include a barrel member, a holding member or a combination thereof.

According to the present disclosure, an electronic device is provided. The electronic device includes the aforementioned image capturing device. Therefore, the image quality of the long-shot can be improved and a distance scene can be clearly imaged on the image surface while the compact size of the electronic device is maintained. Preferably, the electronic device can further include but not limited to a control unit, a display, a storage unit, a random access memory unit (RAM), a read only memory unit (ROM) or a combination thereof.

According to the above description of the present disclosure, the following 1st-13th specific embodiments are provided for further explanation.

1st Embodiment

Figure 2:
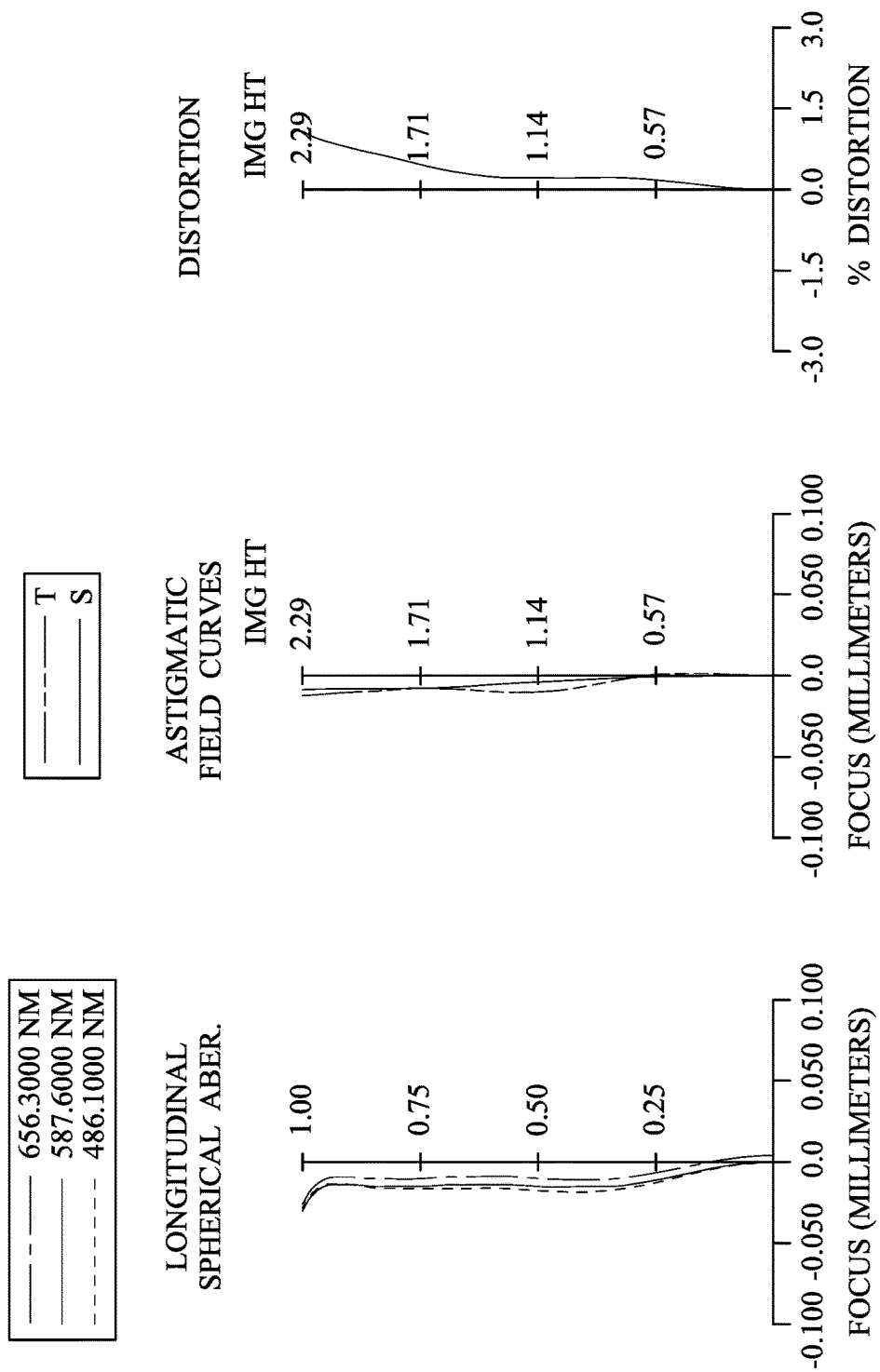
FIG. 2 shows spherical aberration curves, astigmatic field curves and a distortion curve of the image capturing device according to the 1st embodiment.

FIG. 1 is a schematic view of an image capturing device according to the 1st embodiment of the present disclosure. FIG. 2 shows spherical aberration curves, astigmatic field curves and a distortion curve of the image capturing device according to the 1st embodiment. In FIG. 1, the image capturing device includes a photographing optical lens assembly (its reference numeral is omitted) and an image sensor 180. The photographing optical lens assembly includes, in order from an object side to an image side, an aperture stop 100, a first lens element 110, a second lens element 120, a third lens element 130, a fourth lens element 140, a fifth lens element 150, an IR-cut filter 160 and an image surface 170. The image sensor 180 is disposed on the image surface 170 of the photographing optical lens assembly. The photographing optical lens assembly has a total of five lens elements (110-150) with refractive power. No relative movement is between any two of the first lens element 110, the second lens element 120, the third lens element 130, the fourth lens element 140 and the fifth lens element 150. An axial distance is between any two of the first lens element 110, the second lens element 120, the third lens element 130, the fourth lens element 140 and the fifth lens element 150 adjacent to each other.

The first lens element 110 with positive refractive power has a convex object-side surface 111 and a convex image-side surface 112. The first lens element 110 is made of plastic material and has the object-side surface 111 and the image-side surface 112 being both aspheric.

The second lens element 120 with negative refractive power has a convex object-side surface 121 and a concave image-side surface 122. The second lens element 120 is made of plastic material and has the object-side surface 121 and the image-side surface 122 being both aspheric.

The third lens element 130 with negative refractive power has a concave object-side surface 131 and a convex image-side surface 132. The third lens element 130 is made of plastic material and has the object-side surface 131 and 1o the image-side surface 132 being both aspheric. Furthermore, the object-side surface 131 and the image-side surface 132 of the third lens element 130 both have at least one inflection point.

The fourth lens element 140 with positive refractive power has a convex object-side surface 141 and a convex image-side surface 142. The fourth lens element 140 is made of plastic material and has the object-side surface 141 and the image-side surface 142 being both aspheric.

The fifth lens element 150 with negative refractive power has a convex object-side surface 151 and a concave image-side surface 152. The fifth lens element 150 is made of plastic material and has the object-side surface 151 and the image-side surface 152 being both aspheric. Furthermore, the object-side surface 151 and the image-side surface 152 of the fifth lens element 150 both have at least one inflection point. The refractive power of the fifth lens element 150 decreases from a paraxial region to an off-axis region thereof.

Moreover, the refractive power of the first lens element 110 is stronger than the refractive power of the second lens element 120, the third lens element 130, the fourth lens element 140 and the fifth lens element 150.

The IR-cut filter 160 is made of glass material and located between the fifth lens element 150 and the image surface 170, and will not affect a focal length of the photographing optical lens assembly.

The equation of the aspheric surface profiles of the aforementioned lens elements of the 1st embodiment is expressed as follows:

$$X(Y) = (Y^2/R)/(1 + sqrt(1 - (1+k) \times (Y/R)^2)) + \sum_i (Ai) \times (Y^i),$$

where,

X is the relative distance between a point on the aspheric surface spaced at a distance Y from the optical axis and the tangential plane at the aspheric surface vertex on the optical axis;

Y is the vertical distance from the point on the aspheric surface to the optical axis;

R is the curvature radius;

k is the conic coefficient; and

Ai is the i-th aspheric coefficient.

In the photographing optical lens assembly according to the 1st embodiment, when the focal length of the photographing optical lens assembly is f, an f-number of the photographing optical lens assembly is Fno, and a half of a maximal field of view of the photographing optical lens assembly is HFOV, these parameters have the following values: f=5.21 mm; Fno=2.84; and HFOV=23.5 degrees.

In the photographing optical lens assembly according to the 1st embodiment, when an Abbe number of the second lens element 120 is V2, and an Abbe number of the fourth lens element 140 is V4, the following relationship is satisfied: V2+V4=47.00.

In the photographing optical lens assembly according to the 1st embodiment, when a curvature radius of the object-side surface 151 of the fifth lens element 150 is R9, and a curvature radius of the image-side surface 152 of the fifth lens element 150 is R10, the following relationship is satisfied: |R10/R9|=0.48.

In the photographing optical lens assembly according to the 1st embodiment, when a focal length of the first lens element 110 is f1, and an axial distance between the third lens element 130 and the fourth lens element 140 is T34, the following relationship is satisfied: f1/T34=2.42.

In the photographing optical lens assembly according to the 1st embodiment, when a composite focal length of the first lens element 110 and the second lens element 120 is f12, and a composite focal length of the third lens element 130, the fourth lens element 140 and the fifth lens element 150 is f345, the following relationship is satisfied: f12/f345=−0.62.

In the photographing optical lens assembly according to the 1st embodiment, when the focal length of the photographing optical lens assembly is f, and an entrance pupil diameter of the photographing optical lens assembly is EPD, the following relationship is satisfied: f/EPD=2.84.

In the photographing optical lens assembly according to the 1st embodiment, when the focal length of the photographing optical lens assembly is f, the focal length of the first lens element 110 is f1, and a focal length of the second lens element 120 is f2, the following relationship is satisfied: |f/f1|+|f/f2|=3.39.

In the photographing optical lens assembly according to the 1st embodiment, when the focal length of the photographing optical lens assembly is f, the focal length of the first lens element 110 is f1, the focal length of the second lens element 120 is f2, a focal length of the third lens element 130 is f3, a focal length of the fourth lens element 140 is f4, and a focal length of the fifth lens element 150 is f5, the following relationships are satisfied: |f/f1|=2.15; |f/f2|=1.25; |f/f3|=0.31; |f/f4|=0.24; and |f/f5|=0.64. The following relationships are also satisfied: |f/f1|>|f/f2|>|f/f5|>|f/f3|; and |f/f1|>|f/f2|>|f/f5|>|f/f4|.

In the photographing optical lens assembly according to the 1st embodiment, when an axial distance between the stop 100 and the image-side surface 152 of the fifth lens element 150 is SD, and an axial distance between the object-side surface 111 of the first lens element 110 and the image-side surface 152 of the fifth lens element 150 is TD, the following relationship is satisfied: SD/TD=0.93.

In the photographing optical lens assembly according to the 1st embodiment, when the focal length of the photographing optical lens assembly is f, and a maximum image height of the photographing optical lens assembly is ImgH (half of a diagonal length of an effective photosensitive area of the image sensor 180), the following relationship is satisfied: f/ImgH=2.28.

In the photographing optical lens assembly according to the 1st embodiment, when an axial distance between the object-side surface 111 of the first lens element 110 and the image surface 170 is TL, and the maximum image height of the photographing optical lens assembly is ImgH, the following relationship is satisfied: TL/ImgH=2.32.

The detailed optical data of the 1st embodiment are shown in Table 1 and the aspheric surface data are shown in Table 2 below.

TABLE 1

1st Embodiment
f = 5.21 mm, Fno = 2.84, HFOV = 23.5 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Ape. Stop | Plano | | −0.301 | | | | |
| 2 | Lens 1 | 1.526 | ASP | 0.583 | Plastic | 1.544 | 55.9 | 2.43 |
| 3 | | −8.536 | ASP | 0.036 | | | | |
| 4 | Lens 2 | 4.524 | ASP | 0.263 | Plastic | 1.639 | 23.5 | −4.18 |
| 5 | | 1.642 | ASP | 0.544 | | | | |
| 6 | Lens 3 | −2.647 | ASP | 0.258 | Plastic | 1.544 | 55.9 | −16.67 |
| 7 | | −3.866 | ASP | 1.005 | | | | |
| 8 | Lens 4 | 31.668 | ASP | 0.678 | Plastic | 1.639 | 23.5 | 21.65 |
| 9 | | −24.367 | ASP | 0.303 | | | | |
| 10 | Lens 5 | 4.483 | ASP | 0.546 | Plastic | 1.544 | 55.9 | −8.14 |
| 11 | | 2.133 | ASP | 0.500 | | | | |
| 12 | IR-cut filter | Plano | | 0.210 | Glass | 1.517 | 64.2 | — |
| 13 | | Plano | | 0.384 | | | | |
| 14 | Image | Plano | | — | | | | |

Note:
Reference wavelength is 587.6 nm (d-line).

TABLE 2

Aspheric Coefficients

| | Surface # | | | | |
|---|---|---|---|---|---|
| | 2 | 3 | 4 | 5 | 6 |
| k = | −2.5155E−01 | 2.8553E+01 | −4.1329E+01 | −2.9514E+00 | 3.9857E+00 |
| A4 = | 1.2167E−02 | 7.9442E−02 | 3.7244E−02 | 3.1660E−03 | 8.8119E−02 |
| A6 = | 7.1948E−03 | −1.5758E−01 | −1.6147E−01 | 1.0167E−01 | 1.3864E−02 |
| A8 = | −1.7281E−02 | 2.3352E−01 | 3.1994E−01 | −1.5188E−01 | 5.7561E−02 |
| A10 = | 2.4968E−02 | −1.6347E−01 | −2.2014E−01 | 4.8380E−01 | 2.0646E−01 |
| A12 = | −1.5740E−02 | 3.3695E−02 | 3.2719E−02 | −3.5223E−01 | −1.8958E−01 |
| A14 = | | | | 6.8017E−11 | −9.4084E−11 |

| | Surface # | | | | |
|---|---|---|---|---|---|
| | 7 | 8 | 9 | 10 | 11 |
| k = | 9.4907E+00 | 2.8553E+01 | 2.8553E+01 | −4.7133E+00 | −6.1259E−01 |
| A4 = | 8.6447E−02 | −9.8747E−03 | −3.3891E−01 | −1.4957E−01 | −1.9160E−01 |
| A6 = | 2.6139E−01 | −3.9146E−02 | −4.6251E−02 | 3.1019E−02 | 7.8150E−02 |
| A8 = | 2.1804E−02 | 1.3336E−02 | 3.0765E−02 | 1.5469E−02 | −2.4204E−02 |
| A10 = | 1.2436E−01 | −9.8671E−04 | −9.5093E−03 | −8.5488E−03 | 5.3711E−03 |
| A12 = | −8.9434E−02 | 1.0401E−04 | 1.1711E−03 | 1.1239E−03 | −8.0992E−04 |
| A14 = | | | | | 5.7133E−05 |

In Table 1, the curvature radius, the thickness and the focal length are shown in millimeters (mm). Surface numbers 0-14 represent the surfaces sequentially arranged from the object-side to the image-side along the optical axis. In Table 2, k represents the conic coefficient of the equation of the aspheric surface profiles. A4-A14 represent the aspheric coefficients ranging from the 4th order to the 14th order. The tables presented below for each embodiment are the corresponding schematic parameter and aberration curves, and the definitions of the tables are the same as Table 1 and Table 2 of the 1st embodiment. Therefore, an explanation in this regard will not be provided again.

Furthermore, as shown in Table 1, when an axial distance between the first lens element 110 and the second lens element 120 is T12, an axial distance between the second lens element 120 and the third lens element 130 is T23, the axial distance between the third lens element 130 and the fourth lens element 140 is T34, and an axial distance between the fourth lens element 140 and the fifth lens element 150 is T45, T34 is greater than T12, T23 and T45, and the following relationship is satisfied: 0<T12<T45<T23<T34.

Moreover, as shown in Table 1, when a curvature radius of the image-side surface 122 of the second lens element 120 is R4, a curvature radius of the image-side surface 142 of the fourth lens element 140 is R8, the curvature radius of the object-side surface 151 of the fifth lens element 150 is R9, and the curvature radius of the image-side surface 152 of the fifth lens element 150 is R10, the following relationships are satisfied: |R4|<|R8|; |R4|<|R9|; and |R4|<|R10|.

2nd Embodiment

Figure 3:
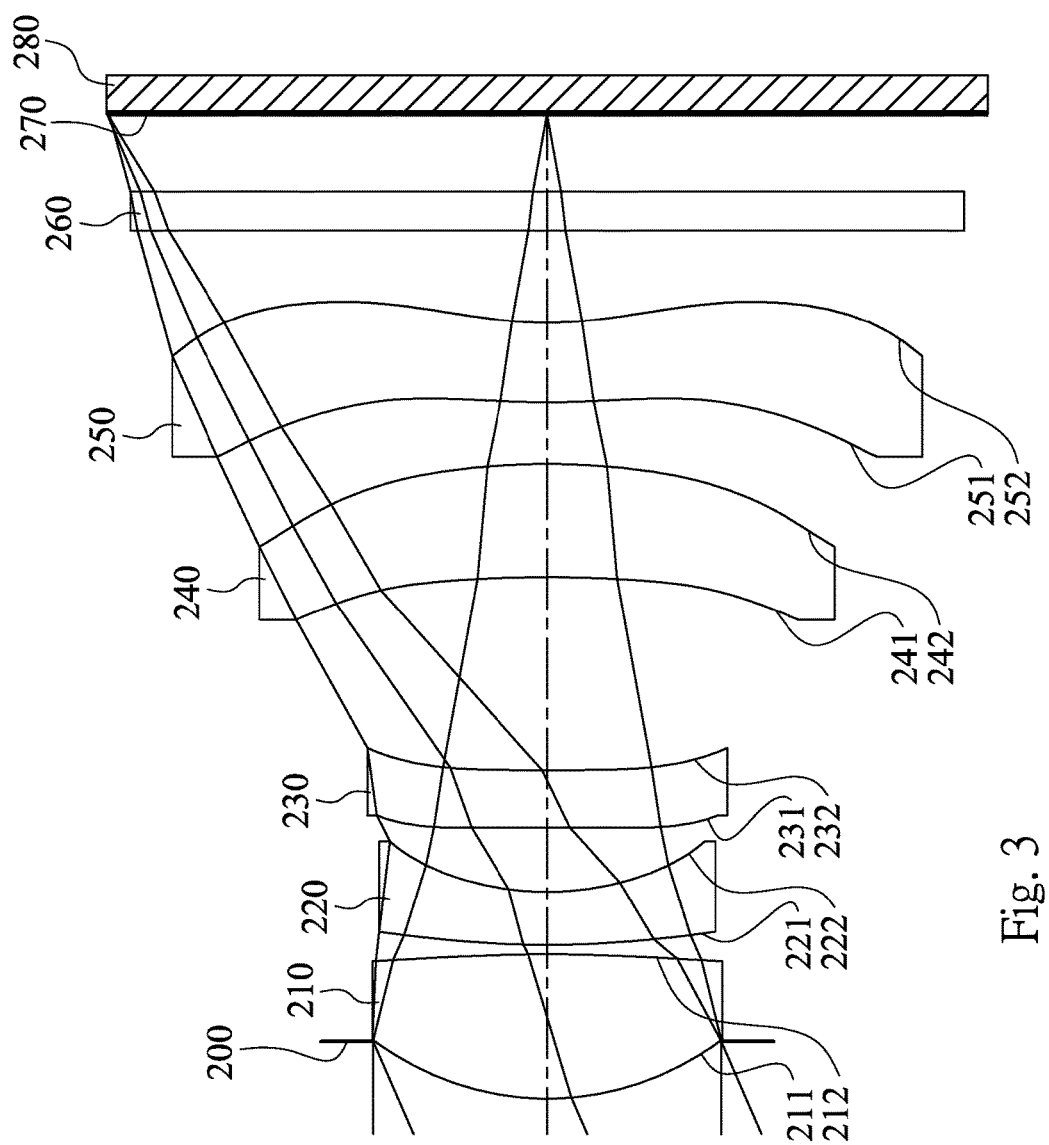
FIG. 3 is a schematic view of an image capturing device according to the 2nd embodiment of the present disclosure.
Figure 4:
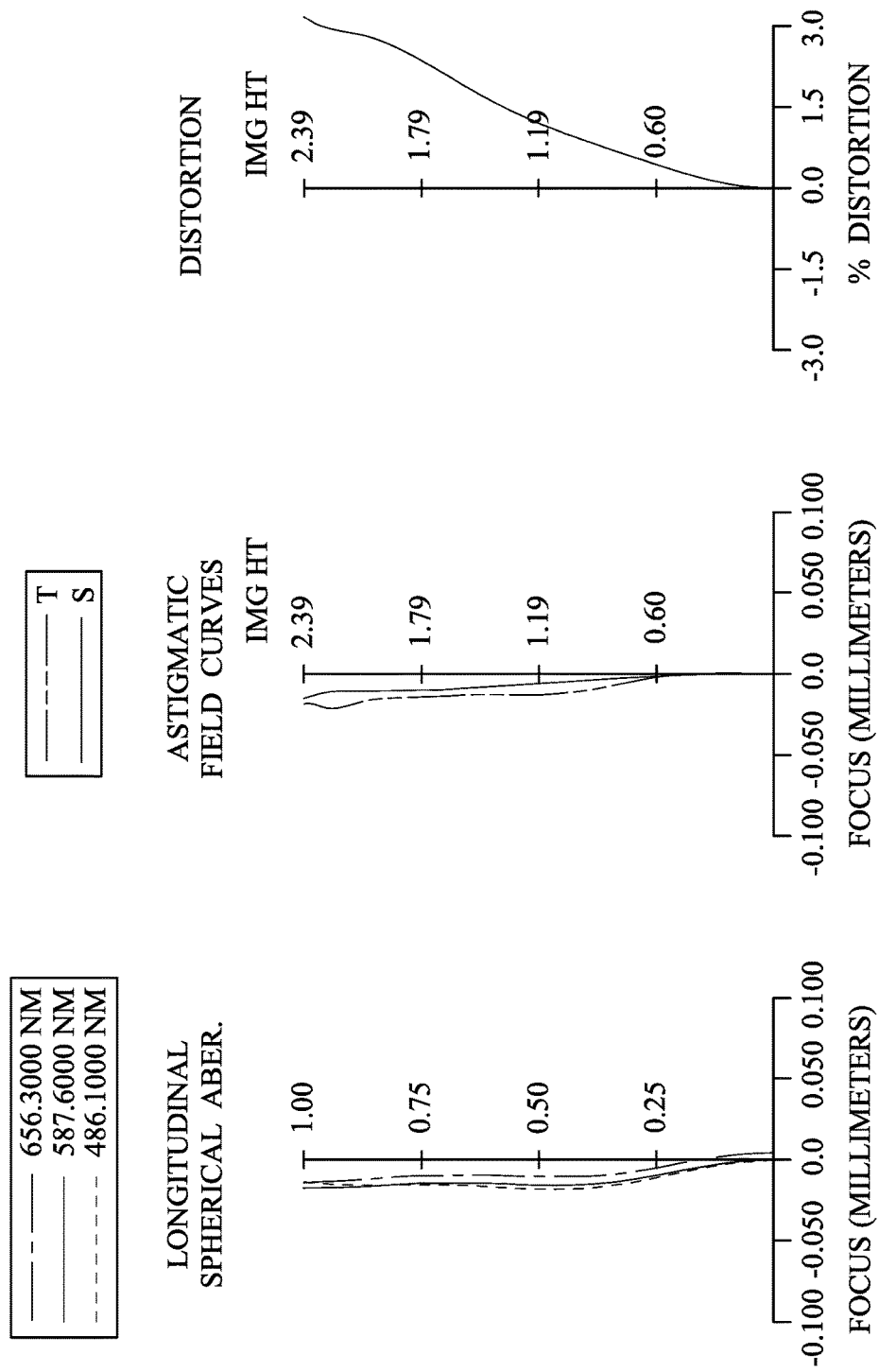
FIG. 4 shows spherical aberration curves, astigmatic field curves and a distortion curve of the image capturing device according to the 2nd embodiment.

FIG. 3 is a schematic view of an image capturing device according to the 2nd embodiment of the present disclosure. FIG. 4 shows spherical aberration curves, astigmatic field curves and a distortion curve of the image capturing device according to the 2nd embodiment. In FIG. 3, the image capturing device includes a photographing optical lens assembly (its reference numeral is omitted) and an image sensor 280. The photographing optical lens assembly includes, in order from an object side to an image side, an aperture stop 200, a first lens element 210, a second lens element 220, a third lens element 230, a fourth lens element 240, a fifth lens element 250, an IR-cut filter 260 and an image surface 270. The image sensor 280 is disposed on the image surface 270 of the photographing optical lens assembly. The photographing optical lens assembly has a total of five lens elements (210-250) with refractive power. No relative movement is between any two of the first lens element 210, the second lens element 220, the third lens element 230, the fourth lens element 240 and the fifth lens element 250. An axial distance is between any two of the first lens element 210, the second lens element 220, the third lens element 230, the fourth lens element 240 and the fifth lens element 250 adjacent to each other.

The first lens element 210 with positive refractive power has a convex object-side surface 211 and a convex image-side surface 212. The first lens element 210 is made of plastic material and has the object-side surface 211 and the image-side surface 212 being both aspheric.

The second lens element 220 with negative refractive power has a convex object-side surface 221 and a concave image-side surface 222. The second lens element 220 is made of plastic material and has the object-side surface 221 and the image-side surface 222 being both aspheric.

The third lens element 230 with negative refractive power has a concave object-side surface 231 and a concave image-side surface 232. The third lens element 230 is made of plastic material and has the object-side surface 231 and the image-side surface 232 being both aspheric. Furthermore, the object-side surface 231 and the image-side surface 232 of the third lens element 230 both have at least one inflection point.

The fourth lens element 240 with positive refractive power has a concave object-side surface 241 and a convex image-side surface 242. The fourth lens element 240 is made of plastic material and has the object-side surface 241 and the image-side surface 242 being both aspheric.

The fifth lens element 250 with negative refractive power has a convex object-side surface 251 and a concave image-side surface 252. The fifth lens element 250 is made of plastic material and has the object-side surface 251 and the image-side surface 252 being both aspheric. Furthermore, the object-side surface 251 and the image-side surface 252 of the fifth lens element 250 both have at least one inflection point. The refractive power of the fifth lens element 250 decreases from a paraxial region to an off-axis region thereof.

Moreover, the refractive power of the first lens element 210 is stronger than the refractive power of the second lens element 220, the third lens element 230, the fourth lens element 240 and the fifth lens element 250.

The IR-cut filter 260 is made of glass material and located between the fifth lens element 250 and the image surface 270, and will not affect a focal length of the photographing optical lens assembly.

The detailed optical data of the 2nd embodiment are shown in Table 3 and the aspheric surface data are shown in Table 4 below.

TABLE 3

2nd Embodiment
f = 5.34 mm, Fno = 2.84, HFOV = 23.5 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Ape. Stop | Plano | | −0.309 | | | | |
| 2 | Lens 1 | 1.548 | ASP | 0.782 | Plastic | 1.544 | 55.9 | 2.42 |
| 3 | | −7.235 | ASP | 0.050 | | | | |
| 4 | Lens 2 | 4.883 | ASP | 0.288 | Plastic | 1.639 | 23.5 | −3.64 |
| 5 | | 1.540 | ASP | 0.350 | | | | |
| 6 | Lens 3 | −17.191 | ASP | 0.308 | Plastic | 1.544 | 55.9 | −16.60 |
| 7 | | 19.157 | ASP | 1.047 | | | | |
| 8 | Lens 4 | −7.762 | ASP | 0.613 | Plastic | 1.639 | 23.5 | 12.02 |
| 9 | | −3.979 | ASP | 0.334 | | | | |
| 10 | Lens 5 | 4.635 | ASP | 0.431 | Plastic | 1.544 | 55.9 | −7.37 |
| 11 | | 2.079 | ASP | 0.500 | | | | |
| 12 | IR-cut filter | Plano | | 0.210 | Glass | 1.517 | 64.2 | — |
| 13 | | Plano | | 0.423 | | | | |
| 14 | Image | Plano | | — | | | | |

Note:
Reference wavelength is 587.6 nm (d-line).

TABLE 4

Aspheric Coefficients

| | Surface # | | | | |
|---|---|---|---|---|---|
| | 2 | 3 | 4 | 5 | 6 |
| k = | −2.9526E−01 | 1.8323E+01 | −4.6318E+01 | −2.3537E+00 | 2.8553E+01 |
| A4 = | 9.7831E−03 | 8.5819E−02 | 3.5994E−02 | 1.3368E−02 | 8.4792E−02 |
| A6 = | 5.7445E−03 | −1.5628E−01 | −1.5755E−01 | 1.0683E−01 | −1.3036E−02 |
| A8 = | −1.3484E−02 | 2.2825E−01 | 3.1031E−01 | −1.1949E−01 | 2.8226E−02 |
| A10 = | 1.7604E−02 | −1.7077E−01 | −2.3522E−01 | 4.7544E−01 | 2.0677E−01 |

TABLE 4-continued

| Aspheric Coefficients | | | | |
|---|---|---|---|---|
| A12 = | −9.2424E−03 | 4.4838E−02 | 5.1043E−02 | −3.5228E−01 | −1.8547E−01 |
| A14 = | | | | 1.5747E−11 | |

| Surface # | | | | |
|---|---|---|---|---|
| 7 | 8 | 9 | 10 | 11 |
| k = | −4.8530E+01 | 2.8542E+01 | −3.0920E+00 | −4.8664E+00 | −4.8746E−01 |
| A4 = | 8.8998E−02 | 3.4628E−03 | 5.8638E−04 | −1.4743E−01 | −1.9573E−01 |
| A6 = | 3.3244E−03 | −3.9941E−02 | −4.7916E−02 | 2.7870E−02 | 7.8150E−02 |
| A8 = | −1.0081E−02 | 1.2994E−02 | 2.9263E−02 | 1.4952E−02 | −2.4302E−02 |
| A10 = | 1.2613E−01 | 5.2787E−04 | −9.7021E−03 | −8.3897E−03 | 5.3117E−03 |
| A12 = | −1.0102E−01 | 7.0911E−04 | 1.5582E−03 | 1.1565E−03 | −8.1708E−04 |
| A14 = | | | | | 6.0177E−05 |

In the 2nd embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 2nd embodiment, so an explanation in this regard will not be provided again.

Moreover, these parameters can be calculated from Table 3 and Table 4 as the following values and satisfy the following conditions:

| 2nd Embodiment | | | |
|---|---|---|---|
| f (mm) | 5.34 | |f/f1| | 2.21 |
| Fno | 2.84 | |f/f2| | 1.47 |
| HFOV (deg.) | 23.5 | |f/f3| | 0.32 |
| V2 + V4 | 47.00 | |f/f4| | 0.44 |
| |R10/R9| | 0.45 | |f/f5| | 0.72 |
| f1/T34 | 2.31 | SD/TD | 0.93 |
| f12/f345 | −0.52 | f/ImgH | 2.24 |
| f/EPD | 2.84 | TL/ImgH | 2.24 |
| |f/f1| + |f/f2| | 3.67 | | |

As shown in the above table, the following relationships are satisfied: |f/f1|>|f/f2|>|f/f5|>|f/f3|; and |f/f1|>|f/f2|>|f/5|>|f/f4|.

Furthermore, as shown in Table 3, when an axial distance between the first lens element 210 and the second lens element 220 is T12, an axial distance between the second lens element 220 and the third lens element 230 is T23, an axial distance between the third lens element 230 and the fourth lens element 240 is T34, and an axial distance between the fourth lens element 240 and the fifth lens element 250 is T45, T34 is greater than T12, T23 and T45, and the following relationship is satisfied: 0<T12<T45<T23<T34.

Moreover, as shown in Table 3, when a curvature radius of the image-side surface 222 of the second lens element 220 is R4, a curvature radius of the image-side surface 242 of the fourth lens element 240 is R8, a curvature radius of the object-side surface 251 of the fifth lens element 250 is R9, and a curvature radius of the image-side surface 252 of the fifth lens element 250 is R10, the following relationships are satisfied: |R4|<|R8|; |R4|<|R9|; and |R4|<|R10|.

3rd Embodiment

Figure 5:
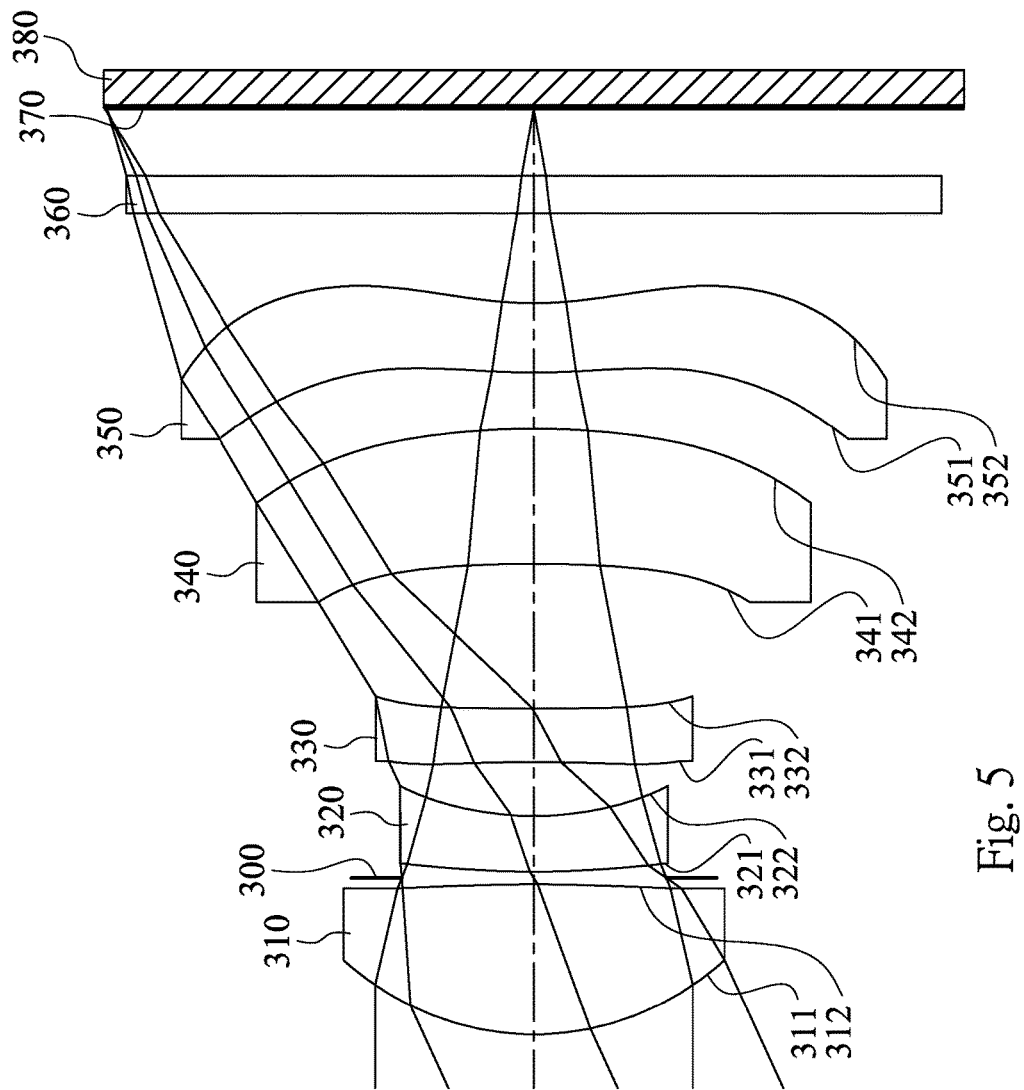
FIG. 5 is a schematic view of an image capturing device according to the 3rd embodiment of the present disclosure.
Figure 6:
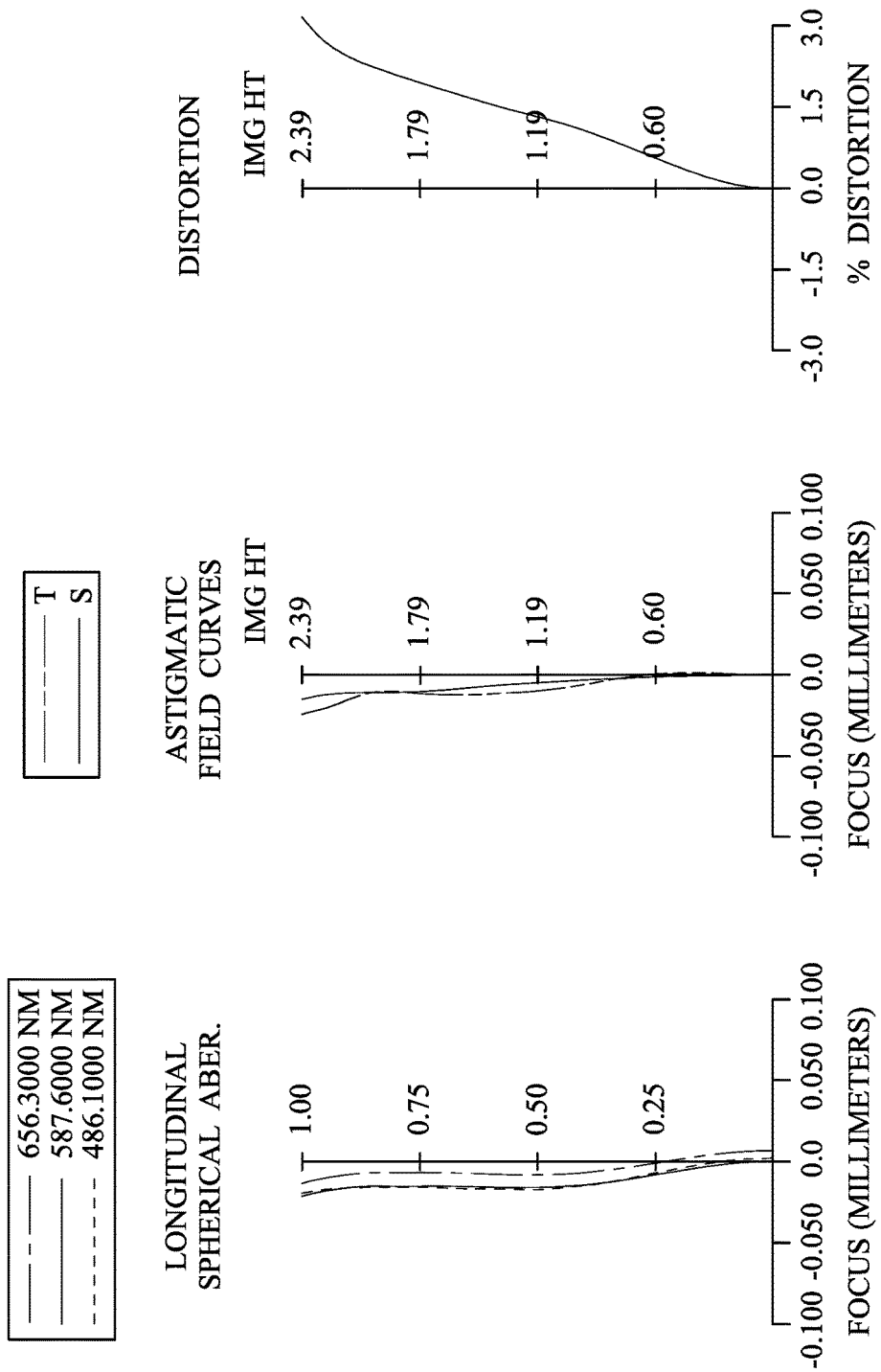
FIG. 6 shows spherical aberration curves, astigmatic field curves and a distortion curve of the image capturing device according to the 3rd embodiment.

FIG. 5 is a schematic view of an image capturing device according to the 3rd embodiment of the present disclosure. FIG. 6 shows spherical aberration curves, astigmatic field curves and a distortion curve of the image capturing device according to the 3rd embodiment. In FIG. 5, the image capturing device includes a photographing optical lens assembly (its reference numeral is omitted) and an image sensor 380. The photographing optical lens assembly includes, in order from an object side to an image side, a first lens element 310, an aperture stop 300, a second lens element 320, a third lens element 330, a fourth lens element 340, a fifth lens element 350, an IR-cut filter 380 and an image surface 370. The image sensor 380 is disposed on the image surface 370 of the photographing optical lens assembly. The photographing optical lens assembly has a total of five lens elements (310-350) with refractive power. No relative movement is between any two of the first lens element 310, the second lens element 320, the third lens element 330, the fourth lens element 340 and the fifth lens element 350. An axial distance is between any two of the first lens element 310, the second lens element 320, the third lens element 330, the fourth lens element 340 and the fifth lens element 350 adjacent to each other.

The first lens element 310 with positive refractive power has a convex object-side surface 311 and a convex image-side surface 312. The first lens element 310 is made of plastic material and has the object-side surface 311 and the image-side surface 312 being both aspheric.

The second lens element 320 with negative refractive power has a convex object-side surface 321 and a concave image-side surface 322. The second lens element 320 is made of plastic material and has the object-side surface 321 and the image-side surface 322 being both aspheric.

The third lens element 330 with negative refractive power has a concave object-side surface 331 and a concave image-side surface 332. The third lens element 330 is made of plastic material and has the object-side surface 331 and the image-side surface 332 being both aspheric. Furthermore, the object-side surface 331 of the third lens element 330 has at least one inflection point.

The fourth lens element 340 with positive refractive power has a concave object-side surface 341 and a convex image-side surface 342. The fourth lens element 340 is made of plastic material and has the object-side surface 341 and the image-side surface 342 being both aspheric.

The fifth lens element 350 with negative refractive power has a convex object-side surface 351 and a concave image-side surface 352. The fifth lens element 350 is made of plastic material and has the object-side surface 351 and the image-side surface 352 being both aspheric. Furthermore, the object-side surface 351 and the image-side surface 352 of the fifth lens element 350 both have at least one inflection point. The refractive power of the fifth lens element 350 decreases from a paraxial region to an off-axis region thereof.

Moreover, the refractive power of the first lens element 310 is stronger than the refractive power of the second lens element 320, the third lens element 330, the fourth lens element 340 and the fifth lens element 350.

The IR-cut filter 360 is made of glass material and located between the fifth lens element 350 and the image surface 370, and will not affect a focal length of the photographing optical lens assembly.

The detailed optical data of the 3rd embodiment are shown in Table 5 and the aspheric surface data are shown in Table 6 below.

In the 3rd embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 3rd embodiment, so an explanation in this regard will not be provided again.

Moreover, these parameters can be calculated from Table 5 and Table 6 as the following values and satisfy the following conditions:

| 3rd Embodiment | | | |
|---|---|---|---|
| f (mm) | 5.08 | |f/f1| | 2.06 |
| Fno | 2.90 | |f/f2| | 1.24 |
| HFOV (deg.) | 24.5 | |f/f3| | 0.34 |
| V2 + V4 | 42.80 | |f/f4| | 0.33 |

TABLE 5

3rd Embodiment
f = 5.08 mm, Fno = 2.90, HFOV = 24.5 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 1.553 | ASP | 0.839 | Plastic | 1.544 | 55.9 | 2.46 |
| 2 | | −7.873 | ASP | 0.035 | | | | |
| 3 | Ape. Stop | Plano | | 0.035 | | | | |
| 4 | Lens 2 | 5.571 | ASP | 0.310 | Plastic | 1.650 | 21.4 | −4.11 |
| 5 | | 1.765 | ASP | 0.300 | | | | |
| 6 | Lens 3 | −8.277 | ASP | 0.303 | Plastic | 1.544 | 55.9 | −14.87 |
| 7 | | 369.206 | ASP | 0.805 | | | | |
| 8 | Lens 4 | −7.257 | ASP | 0.753 | Plastic | 1.650 | 21.4 | 15.27 |
| 9 | | −4.363 | ASP | 0.316 | | | | |
| 10 | Lens 5 | 4.155 | ASP | 0.385 | Plastic | 1.544 | 55.9 | −7.96 |
| 11 | | 2.052 | ASP | 0.500 | | | | |
| 12 | IR-cut filter | Plano | | 0.210 | Glass | 1.517 | 64.2 | — |
| 13 | | Plano | | 0.385 | | | | |
| 14 | Image | Plano | | — | | | | |

Note:
Reference wavelength is 587.6 nm (d-line).

TABLE 6

Aspheric Coefficients

| | Surface # | | | | |
|---|---|---|---|---|---|
| | 1 | 2 | 4 | 5 | 6 |
| k = | −2.8838E−01 | 1.1264E+01 | −3.8314E+01 | −2.8771E+00 | 2.3292E+01 |
| A4 = | 8.9569E−03 | 8.8839E−02 | 3.7159E−02 | 7.1919E−03 | 7.4449E−02 |
| A6 = | 8.1189E−03 | −1.5658E−01 | −1.5375E−01 | 9.8105E−02 | −1.6791E−02 |
| A8 = | −1.2786E−02 | 2.3130E−01 | 3.1005E−01 | −1.5419E−01 | 4.7332E−02 |
| A10 = | 1.4857E−02 | −1.7662E−01 | −2.5010E−01 | 5.1974E−01 | 2.4351E−01 |
| A12 = | −5.7151E−03 | 4.6514E−02 | 5.3982E−02 | −3.5229E−01 | −2.2060E−01 |
| A14 = | | | | −4.9413E−07 | |

| | Surface # | | | | |
|---|---|---|---|---|---|
| | 7 | 8 | 9 | 10 | 11 |
| k = | −7.2365E+01 | 2.6616E+01 | −4.8247E+00 | −3.3435E+00 | −6.0734E−01 |
| A4 = | 8.7165E−02 | 4.3791E−04 | 6.9575E−03 | −1.6008E−01 | −2.1257E−01 |
| A6 = | −2.0551E−03 | −4.2937E−02 | −4.6976E−02 | 2.6391E−02 | 7.8150E−02 |
| A8 = | 5.7558E−03 | 1.0750E−02 | 2.7827E−02 | 1.5389E−02 | −2.4218E−02 |
| A10 = | 1.2434E−01 | −2.0614E−03 | −9.6692E−03 | −8.4088E−03 | 5.3444E−03 |
| A12 = | −1.0606E−01 | 1.4755E−03 | 1.5017E−03 | 1.1477E−03 | −8.1693E−04 |
| A14 = | | | | | 5.4979E−05 |

-continued

| 3rd Embodiment | | | |
|---|---|---|---|
| \|R10/R9\| | 0.49 | \|f/f5\| | 0.64 |
| f1/T34 | 3.06 | SD/TD | 0.79 |
| f12/f345 | −0.55 | f/ImgH | 2.13 |
| f/EPD | 2.90 | TL/ImgH | 2.17 |
| \|f/f1\| + \|f/f2\| | 3.30 | | |

As shown in the above table, the following relationships are satisfied: |f/f1|>|f/f2|>|f/f5|>|f/f3|; and |f/f1|>|f/f2|>|f/f5|>|f/f4|.

Furthermore, as shown in Table 5, when an axial distance between the first lens element 310 and the second lens element 320 is T12, an axial distance between the second lens element 320 and the third lens element 330 is T23, an axial distance between the third lens element 330 and the fourth lens element 340 is T34, and an axial distance between the fourth lens element 340 and the fifth lens element 350 is T45, T34 is greater than T12, T23 and T45.

Moreover, as shown in Table 5, when a curvature radius of the image-side surface 322 of the second lens element 320 is R4, a curvature radius of the image-side surface 342 of the fourth lens element 340 is R8, a curvature radius of the object-side surface 351 of the fifth lens element 350 is R9, and a curvature radius of the image-side surface 352 of the fifth lens element 350 is R10, the following relationships are satisfied: |R4|<|R8|; |R4|<|R9|; and |R4|<|R10|.

4th Embodiment

Figure 7:
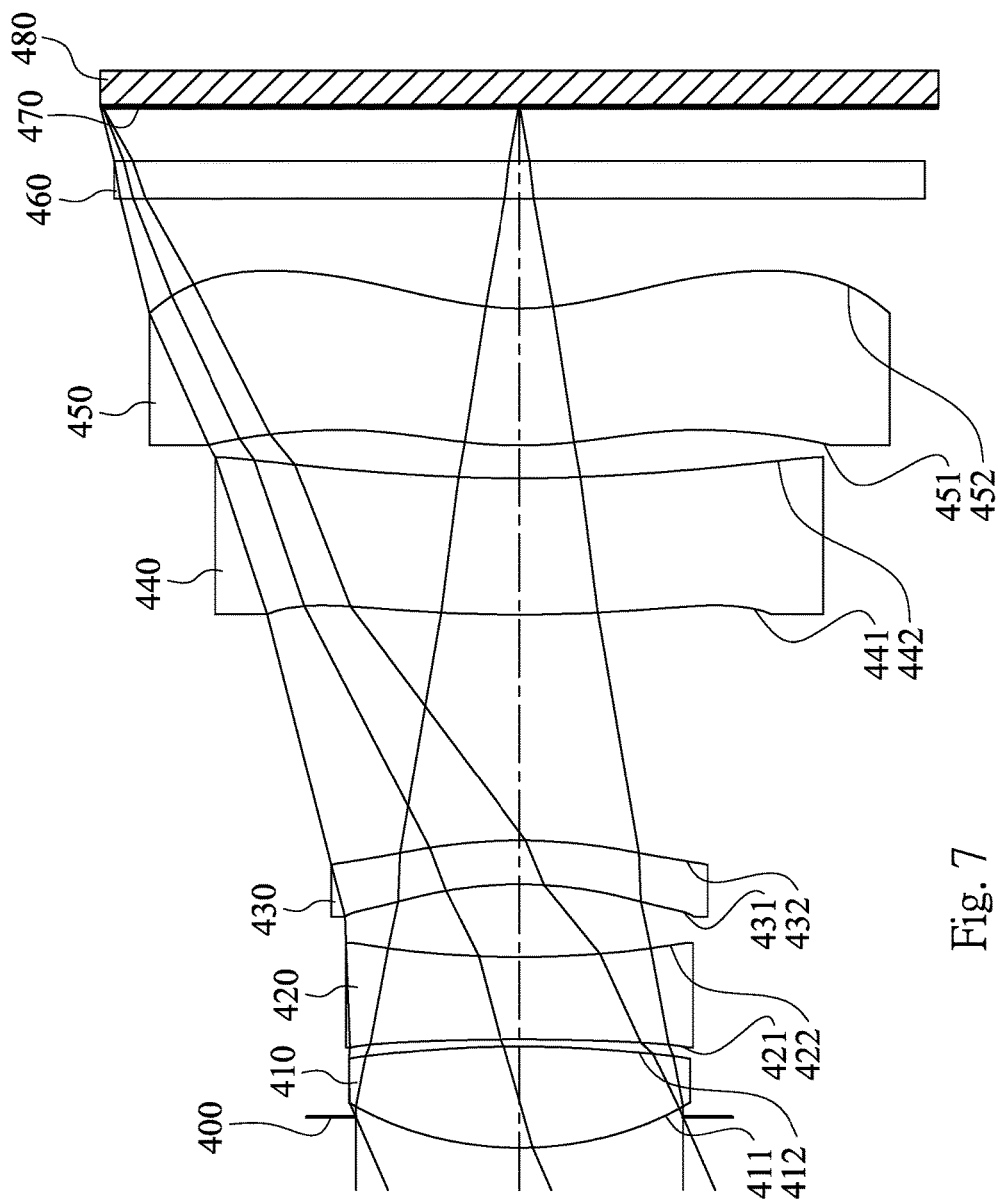
FIG. 7 is a schematic view of an image capturing device according to the 4th embodiment of the present disclosure.
Figure 8:
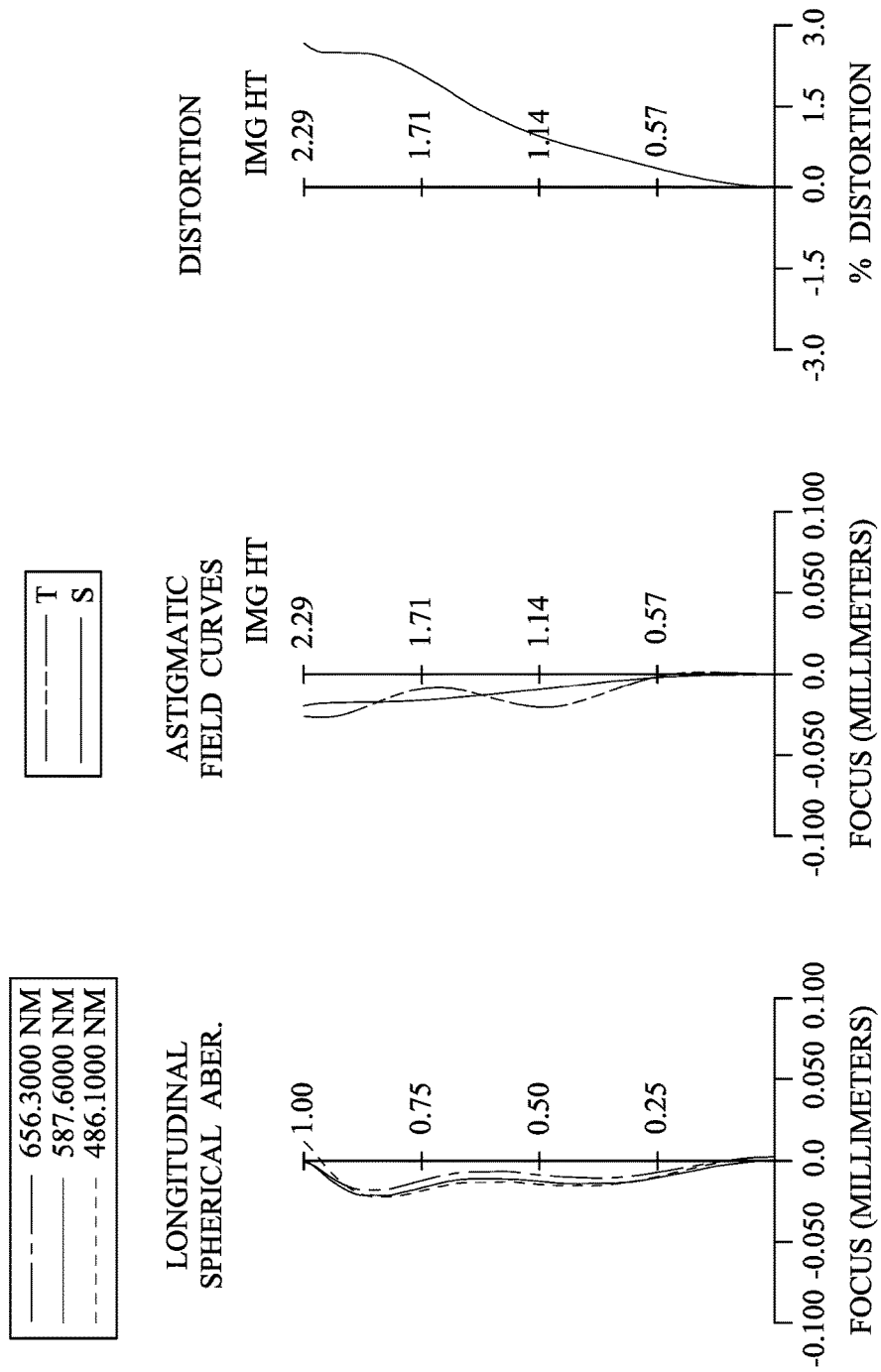
FIG. 8 shows spherical aberration curves, astigmatic field curves and a distortion curve of the image capturing device according to the 4th embodiment.

FIG. 7 is a schematic view of an image capturing device according to the 4th embodiment of the present disclosure. FIG. 8 shows spherical aberration curves, astigmatic field curves and a distortion curve of the image capturing device according to the 4th embodiment. In FIG. 7, the image capturing device includes a photographing optical lens assembly (its reference numeral is omitted) and an image sensor 480. The photographing optical lens assembly includes, in order from an object side to an image side, an aperture stop 400, a first lens element 410, a second lens element 420, a third lens element 430, a fourth lens element 440, a fifth lens element 450, an IR-cut filter 460 and an image surface 470. The image sensor 480 is disposed on the image surface 470 of the photographing optical lens assembly. The photographing optical lens assembly has a total of five lens elements (410-450) with refractive power. No relative movement is between any two of the first lens element 410, the second lens element 420, the third lens element 430, the fourth lens element 440 and the fifth lens element 450. An axial distance is between any two of the first lens element 410, the second lens element 420, the third lens element 430, the fourth lens element 440 and the fifth lens element 450 adjacent to each other.

The first lens element 410 with positive refractive power has a convex object-side surface 411 and a convex image-side surface 412. The first lens element 410 is made of plastic material and has the object-side surface 411 and the image-side surface 412 being both aspheric.

The second lens element 420 with negative refractive power has a concave object-side surface 421 and a concave image-side surface 422. The second lens element 420 is made of plastic material and has the object-side surface 421 and the image-side surface 422 being both aspheric.

The third lens element 430 with negative refractive power has a concave object-side surface 431 and a convex image-side surface 432. The third lens element 430 is made of plastic material and has the object-side surface 431 and the image-side surface 432 being both aspheric. Furthermore, the object-side surface 431 and the image-side surface 432 of the third lens element 430 both have at least one inflection point.

The fourth lens element 440 with negative refractive power has a convex object-side surface 441 and a concave image-side surface 442. The fourth lens element 440 is made of plastic material and has the object-side surface 441 and the image-side surface 442 being both aspheric.

The fifth lens element 450 with negative refractive power has a convex object-side surface 451 and a concave image-side surface 452. The fifth lens element 450 is made of plastic material and has the object-side surface 451 and the image-side surface 452 being both aspheric. Furthermore, the object-side surface 451 and the image-side surface 452 of the fifth lens element 450 both have at least one inflection point. The refractive power of the fifth lens element 450 decreases from a paraxial region to an off-axis region thereof.

Moreover, the refractive power of the first lens element 410 is stronger than the refractive power of the second lens element 420, the third lens element 430, the fourth lens element 440 and the fifth lens element 450.

The IR-cut filter 460 is made of glass material and located between the fifth lens element 450 and the image surface 470, and will not affect a focal length of the photographing optical lens assembly.

The detailed optical data of the 4th embodiment are shown in Table 7 and the aspheric surface data are shown in Table 8 below.

TABLE 7

4th Embodiment
f = 5.08 mm, Fno = 2.84, HFOV = 23.7 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Ape. Stop | Plano | | −0.169 | | | | |
| 2 | Lens 1 | 1.958 | ASP | 0.559 | Plastic | 1.544 | 55.9 | 2.68 |
| 3 | | −5.170 | ASP | 0.038 | | | | |
| 4 | Lens 2 | −11.737 | ASP | 0.450 | Plastic | 1.639 | 23.5 | −5.49 |
| 5 | | 5.076 | ASP | 0.398 | | | | |
| 6 | Lens 3 | −2.292 | ASP | 0.240 | Plastic | 1.544 | 55.9 | −20.44 |
| 7 | | −2.994 | ASP | 1.239 | | | | |
| 8 | Lens 4 | 9.719 | ASP | 0.750 | Plastic | 1.544 | 55.9 | −912.48 |
| 9 | | 9.273 | ASP | 0.179 | | | | |
| 10 | Lens 5 | 2.332 | ASP | 0.750 | Plastic | 1.544 | 55.9 | −15.35 |

TABLE 7-continued

4th Embodiment
f = 5.08 mm, Fno = 2.84, HFOV = 23.7 deg.

| Surface # | | Curvature Radius | | Thickness | Material | Index | Abbe # | Focal Length |
|---|---|---|---|---|---|---|---|---|
| 11 | | 1.616 | ASP | 0.600 | | | | |
| 12 | IR-cut filter | Plano | | 0.210 | Glass | 1.517 | 64.2 | — |
| 13 | | Plano | | 0.297 | | | | |
| 14 | Image | Plano | | — | | | | |

Note:
Reference wavelength is 587.6 nm (d-line).

TABLE 8

Aspheric Coefficients

| Surface # | 2 | 3 | 4 | 5 | 6 |
|---|---|---|---|---|---|
| k = | −2.4749E−01 | 1.1134E+01 | 2.8553E+01 | −1.2349E+01 | 4.3415E+00 |
| A4 = | 1.0695E−02 | 8.4988E−02 | 4.1477E−02 | −1.7500E−02 | 5.1978E−02 |
| A6 = | 1.4756E−02 | −1.5037E−01 | −1.6505E−01 | 4.6901E−02 | 8.8899E−03 |
| A8 = | −2.5550E−02 | 2.4616E−01 | 3.0290E−01 | −1.8437E−01 | 6.9461E−02 |
| A10 = | 4.7080E−02 | −1.6332E−01 | −2.2624E−01 | 4.6121E−01 | 2.2964E−01 |
| A12 = | −2.5957E−02 | 4.0570E−03 | 1.7876E−02 | −3.2769E−01 | −1.8473E−01 |
| A14 = | | | | −1.2111E−08 | −1.5625E−08 |

| Surface # | 7 | 8 | 9 | 10 | 11 |
|---|---|---|---|---|---|
| k = | 5.4365E+00 | 2.1908E+01 | 2.0325E+01 | −1.7738E+00 | −1.0121E+00 |
| A4 = | 4.0285E−02 | 3.3677E−02 | 1.3226E−02 | −1.6113E−01 | −1.9260E−01 |
| A6 = | 9.1812E−03 | −5.8411E−02 | −4.1258E−02 | 2.9877E−02 | 7.8150E−02 |
| A8 = | 1.6327E−02 | 2.0840E−02 | 3.0265E−02 | 1.6280E−02 | −2.4798E−02 |
| A10 = | 1.1466E−01 | −1.5392E−03 | −9.5886E−03 | −8.5271E−03 | 5.4338E−03 |
| A12 = | −8.9106E−02 | −1.3892E−03 | 1.0668E−03 | 1.1071E−03 | −7.9640E−04 |
| A14 = | | | | | 5.4438E−05 |

In the 4th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 4th embodiment, so an explanation in this regard will not be provided again.

Moreover, these parameters can be calculated from Table 7 and Table 8 as the following values and satisfy the following conditions:

| 4th Embodiment | | | |
|---|---|---|---|
| f (mm) | 5.08 | |f/f1| | 1.89 |
| Fno | 2.84 | |f/f2| | 0.93 |
| HFOV (deg.) | 23.7 | |f/f3| | 0.25 |
| V2 + V4 | 79.40 | |f/f4| | 0.01 |
| |R10/R9| | 0.69 | |f/f5| | 0.33 |
| f1/T34 | 2.17 | SD/TD | 0.96 |
| f12/f345 | −0.59 | f/ImgH | 2.22 |
| f/EPD | 2.84 | TL/ImgH | 2.50 |
| |f/f1| + |f/f2| | 2.82 | | |

As shown in the above table, the following relationships are satisfied: |f/f1|>|f/f2|>|f/f5|>|f/f3|; and |f/f1|>|f/f2|>|f/f5|>|f/f4|.

Furthermore, as shown in Table 7, when an axial distance between the first lens element 410 and the second lens element 420 is T12, an axial distance between the second lens element 420 and the third lens element 430 is T23, an axial distance between the third lens element 430 and the fourth lens element 440 is T34, and an axial distance between the fourth lens element 440 and the fifth lens element 450 is T45, T34 is greater than T12, T23 and T45, and the following relationship is satisfied: 0<T12<T45<T23<T34.

5th Embodiment

Figure 9:
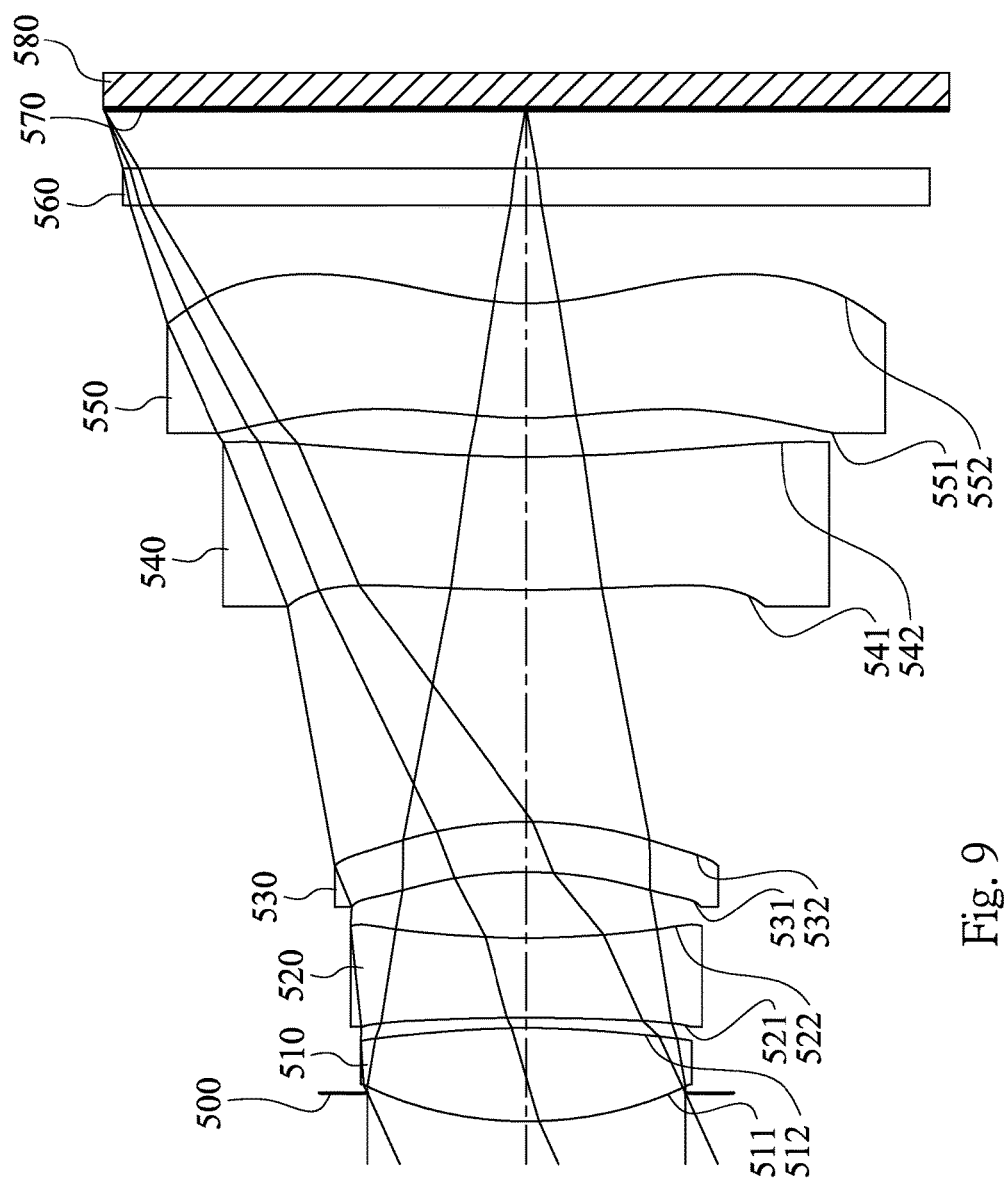
FIG. 9 is a schematic view of an image capturing device according to the 5th embodiment of the present disclosure.
Figure 10:
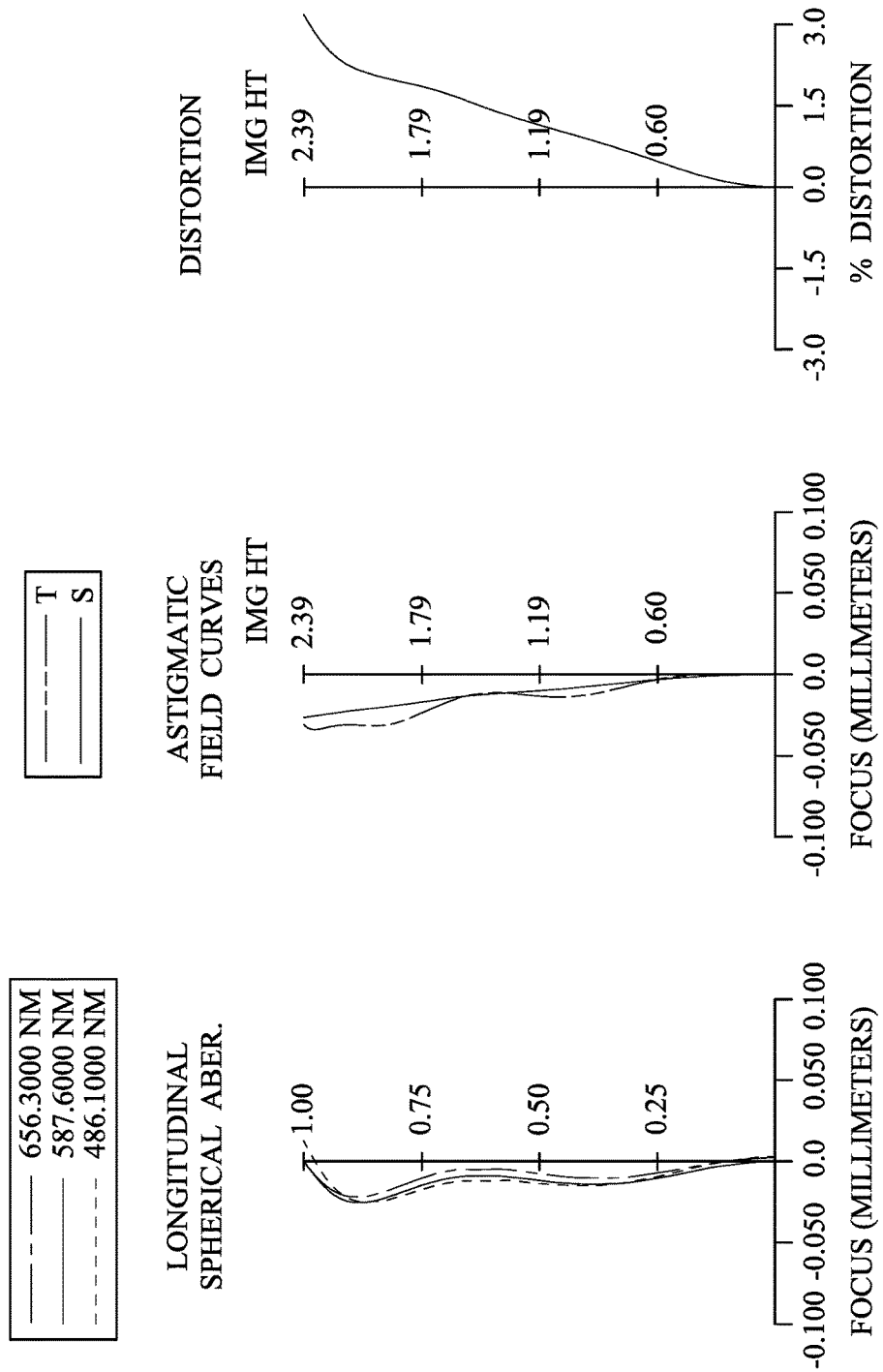
FIG. 10 shows spherical aberration curves, astigmatic field curves and a distortion curve of the image capturing device according to the 5th embodiment.

FIG. 9 is a schematic view of an image capturing device according to the 5th embodiment of the present disclosure. FIG. 10 shows spherical aberration curves, astigmatic field curves and a distortion curve of the image capturing device according to the 5th embodiment. In FIG. 9, the image capturing device includes a photographing optical lens assembly (its reference numeral is omitted) and an image sensor 580. The photographing optical lens assembly includes, in order from an object side to an image side, an aperture stop 500, a first lens element 510, a second lens element 520, a third lens element 530, a fourth lens element 540, a fifth lens element 550, an IR-cut filter 560 and an image surface 570. The image sensor 580 is disposed on the image surface 570 of the photographing optical lens assembly. The photographing optical lens assembly has a total of five lens elements (510-550) with refractive power. No relative movement is between any two of the first lens element 510, the second lens element 520, the third lens element 530, the fourth lens element 540 and the fifth lens element 550. An axial distance is between any two of the first lens element 510, the second lens element 520, the third lens element 530, the fourth lens element 540 and the fifth lens element 550 adjacent to each other.

The first lens element 510 with positive refractive power has a convex object-side surface 511 and a convex image-side surface 512. The first lens element 510 is made of plastic material and has the object-side surface 511 and the image-side surface 512 being both aspheric.

The second lens element 520 with negative refractive power has a concave object-side surface 521 and a concave image-side surface 522. The second lens element 520 is made of plastic material and has the object-side surface 521 and the image-side surface 522 being both aspheric.

The third lens element 530 with positive refractive power has a concave object-side surface 531 and a convex image-side surface 532. The third lens element 530 is made of plastic material and has the object-side surface 531 and the image-side surface 532 being both aspheric. Furthermore, the object-side surface 531 of the third lens element 530 has at least one inflection point.

The fourth lens element 540 with negative refractive power has a convex object-side surface 541 and a concave image-side surface 542. The fourth lens element 540 is made of plastic material and has the object-side surface 541 and the image-side surface 542 being both aspheric.

The fifth lens element 550 with negative refractive power has a convex object-side surface 551 and a concave image-side surface 552. The fifth lens element 550 is made of plastic material and has the object-side surface 551 and the image-side surface 552 being both aspheric. Furthermore, the object-side surface 551 and the image-side surface 552 of the fifth lens element 550 both have at least one inflection point. The refractive power of the fifth lens element 550 decreases from a paraxial region to an off-axis region thereof.

Moreover, the refractive power of the first lens element 510 is stronger than the refractive power of the second lens element 520, the third lens element 530, the fourth lens element 540 and the fifth lens element 550.

The IR-cut filter 560 is made of glass material and located between the fifth lens element 550 and the image surface 570, and will not affect a focal length of the photographing optical lens assembly.

The detailed optical data of the 5th embodiment are shown in Table 9 and the aspheric surface data are shown in Table 10 below.

TABLE 9

5th Embodiment
f = 5.09 mm, Fno = 2.84, HFOV = 24.5 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Ape. Stop | Plano | | −0.161 | | | | |
| 2 | Lens 1 | 2.219 | ASP | 0.527 | Plastic | 1.544 | 55.9 | 2.83 |
| 3 | | −4.587 | ASP | 0.057 | | | | |
| 4 | Lens 2 | −11.902 | ASP | 0.450 | Plastic | 1.639 | 23.5 | −5.52 |
| 5 | | 5.087 | ASP | 0.375 | | | | |
| 6 | Lens 3 | −2.371 | ASP | 0.283 | Plastic | 1.544 | 55.9 | 146.21 |
| 7 | | −2.400 | ASP | 1.310 | | | | |
| 8 | Lens 4 | 10.245 | ASP | 0.750 | Plastic | 1.544 | 55.9 | −144.21 |
| 9 | | 8.828 | ASP | 0.219 | | | | |
| 10 | Lens 5 | 2.943 | ASP | 0.649 | Plastic | 1.544 | 55.9 | −9.38 |
| 11 | | 1.722 | ASP | 0.550 | | | | |
| 12 | IR-cut filter | Plano | | 0.210 | Glass | 1.517 | 64.2 | — |
| 13 | | Plano | | 0.333 | | | | |
| 14 | Image | Plano | | — | | | | |

Note:
Reference wavelength is 587.6 nm (d-line).

TABLE 10

Aspheric Coefficients

| Surface # | 2 | 3 | 4 | 5 | 6 |
|---|---|---|---|---|---|
| k = | −3.5589E−01 | 9.2359E+00 | 2.8553E+01 | −1.5271E+01 | 4.6204E+00 |
| A4 = | 8.4096E−03 | 8.9836E−02 | 3.8166E−02 | −2.0012E−02 | 4.1789E−02 |
| A6 = | 1.4703E−02 | −1.4829E−01 | −1.6422E−01 | 4.4756E−02 | −6.5949E−03 |
| A8 = | −3.0489E−02 | 2.5258E−01 | 3.0150E−01 | −1.8022E−01 | 7.2862E−02 |
| A10 = | 5.7860E−02 | −1.6953E−01 | −2.1730E−01 | 4.7256E−01 | 2.4212E−01 |
| A12 = | −3.1332E−02 | 8.6002E−03 | 2.9168E−03 | −3.4744E−01 | −1.7851E−01 |
| A14 = | | | | 6.0417E−03 | −6.5435E−03 |

| Surface # | 7 | 8 | 9 | 10 | 11 |
|---|---|---|---|---|---|
| k = | 3.4741E+00 | −7.2365E+01 | 2.0282E+01 | −2.7657E+00 | −1.0548E+00 |
| A4 = | 2.7678E−02 | 1.8822E−02 | 1.0352E−02 | −1.5959E−01 | −1.9510E−01 |
| A6 = | 7.6148E−04 | −5.4753E−02 | −4.2697E−02 | 3.0496E−02 | 7.8150E−02 |
| A8 = | 1.0756E−02 | 1.9475E−02 | 3.0125E−02 | 1.6550E−02 | −2.4884E−02 |
| A10 = | 1.1961E−01 | −2.1517E−03 | −9.5875E−03 | −8.5021E−03 | 5.4494E−03 |
| A12 = | −7.6186E−02 | −1.9300E−03 | 1.0875E−03 | 1.1030E−03 | −7.8841E−04 |
| A14 = | | | | | 5.5097E−05 |

In the 5th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 5th embodiment, so an explanation in this regard will not be provided again.

Moreover, these parameters can be calculated from Table 9 and Table 10 as the following values and satisfy the following conditions:

| 5th Embodiment | | | |
|---|---|---|---|
| f (mm) | 5.09 | \|f/f1\| | 1.80 |
| Fno | 2.84 | \|f/f2\| | 0.92 |
| HFOV (deg.) | 24.5 | \|f/f3\| | 0.03 |
| V2 + V4 | 79.40 | \|f/f4\| | 0.04 |
| \|R10/R9\| | 0.59 | \|f/f5\| | 0.542 |
| f1/T34 | 2.16 | SD/TD | 0.97 |
| f12/f345 | −0.53 | f/ImgH | 2.13 |
| f/EPD | 2.84 | TL/ImgH | 2.40 |
| \|f/f1\| + \|f/f2\| | 2.72 | | |

As shown in the above table, the following relationships are satisfied: |f/f1|>|f/f2|>|f/f5|>|f/f3|; and |f/f1|>/f2|>|f/f5|>|f/f4|.

Furthermore, as shown in Table 9, when an axial distance between the first lens element 510 and the second lens element 520 is T12, an axial distance between the second lens element 520 and the third lens element 530 is T23, an axial distance between the third lens element 530 and the fourth lens element 540 is T34, and an axial distance between the fourth lens element 540 and the fifth lens element 550 is T45, T34 is greater than T12, T23 and T45, and the following relationship is satisfied: 0<T12<T45<T23<T34.

6th Embodiment

Figure 11:
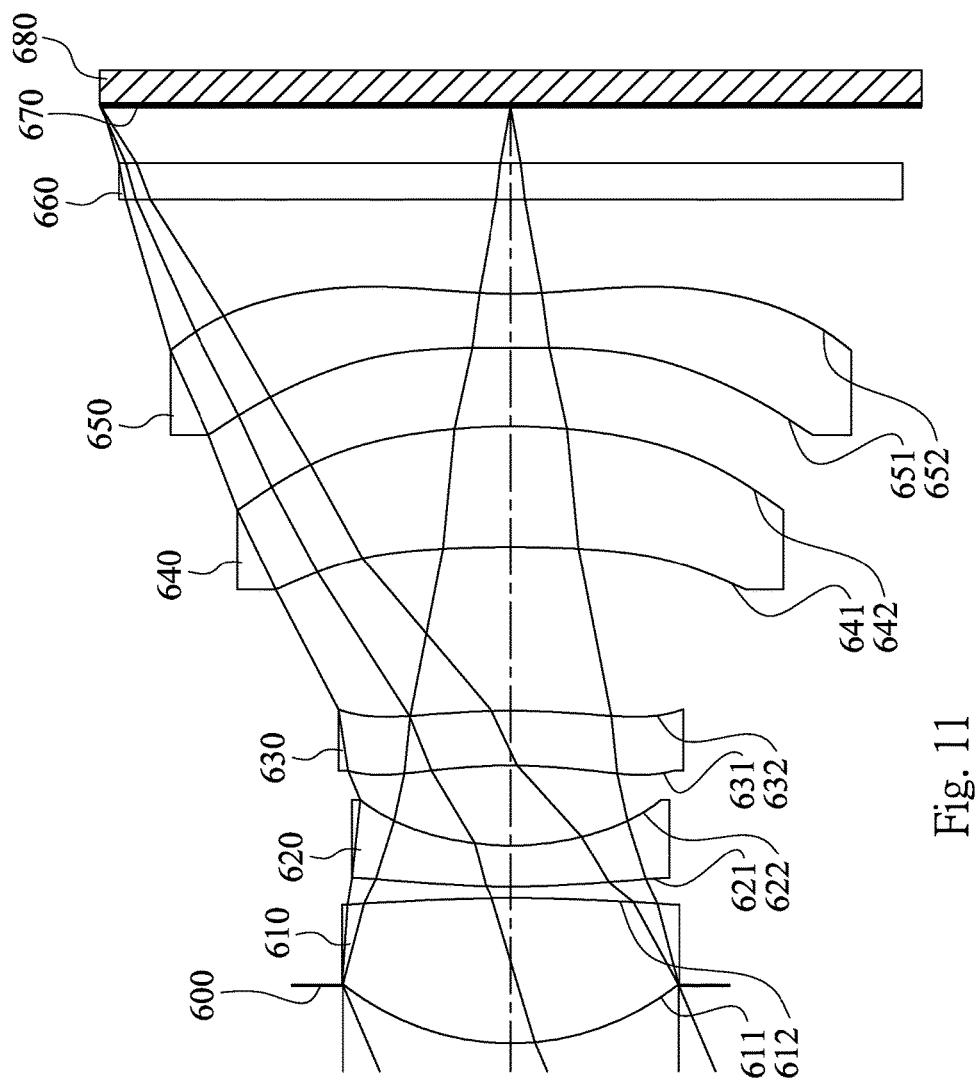
FIG. 11 is a schematic view of an image capturing device according to the 6th embodiment of the present disclosure.
Figure 12:
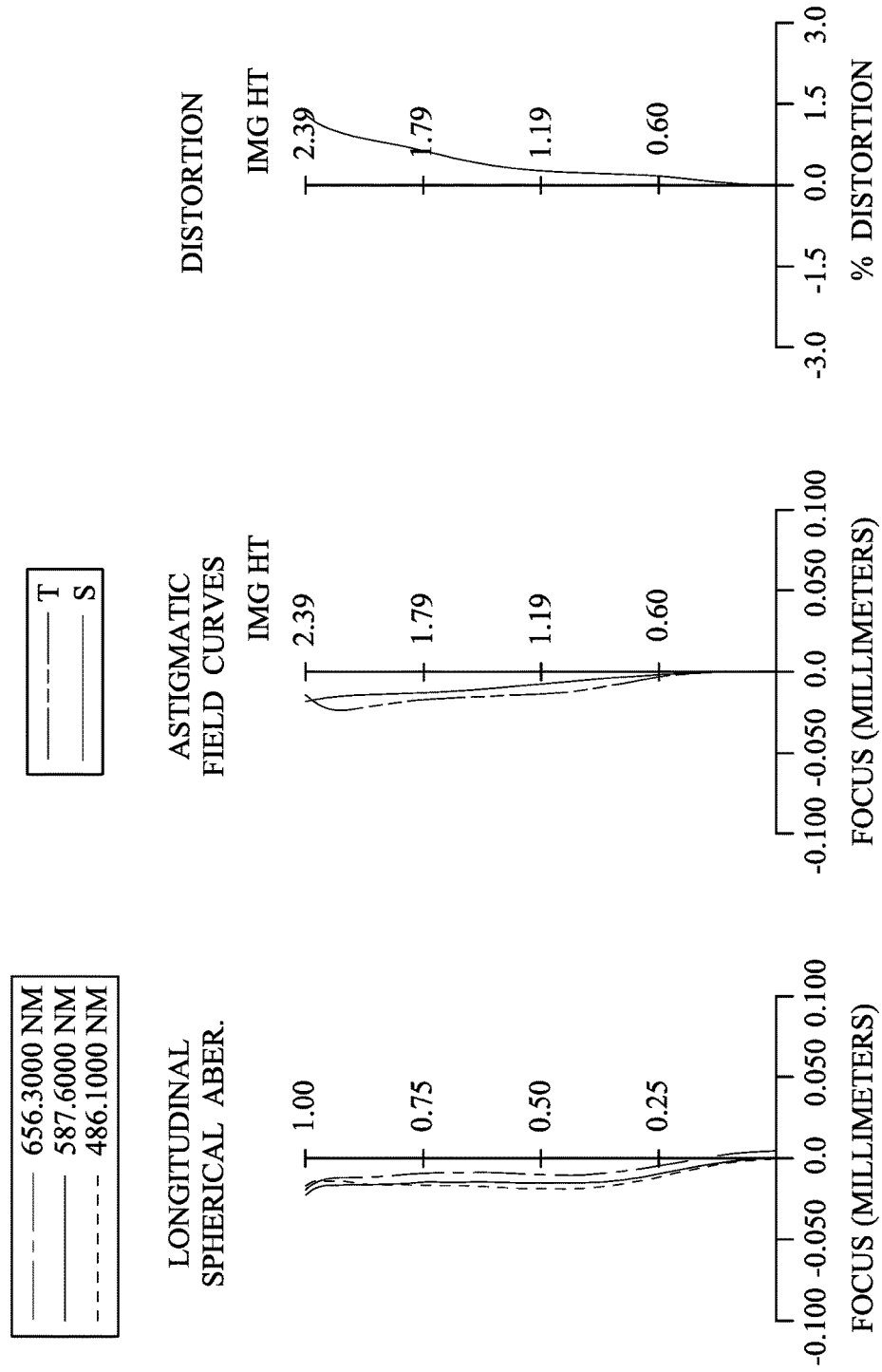
FIG. 12 shows spherical aberration curves, astigmatic field curves and a distortion curve of the image capturing device according to the 6th embodiment.

FIG. 11 is a schematic view of an image capturing device according to the 6th embodiment of the present disclosure. FIG. 12 shows spherical aberration curves, astigmatic field curves and a distortion curve of the image capturing device according to the 6th embodiment. In FIG. 11, the image capturing device includes a photographing optical lens assembly (its reference numeral is omitted) and an image sensor 680. The photographing optical lens assembly includes, in order from an object side to an image side, an aperture stop 600, a first lens element 610, a second lens element 620, a third lens element 630, a fourth lens element 640, a fifth lens element 650, an IR-cut filter 660 and an image surface 670. The image sensor 680 is disposed on the image surface 670 of the photographing optical lens assembly. The photographing optical lens assembly has a total of five lens elements (610-650) with refractive power. No relative movement is between any two of the first lens element 610, the second lens element 620, the third lens element 630, the fourth lens element 640 and the fifth lens element 650. An axial distance is between any two of the first lens element 610, the second lens element 620, the third lens element 630, the fourth lens element 640 and the fifth lens element 650 adjacent to each other.

The first lens element 610 with positive refractive power has a convex object-side surface 611 and a convex image-side surface 612. The first lens element 610 is made of plastic material and has the object-side surface 611 and the image-side surface 612 being both aspheric.

The second lens element 620 with negative refractive power has a convex object-side surface 621 and a concave image-side surface 622. The second lens element 620 is made of plastic material and has the object-side surface 621 and the image-side surface 622 being both aspheric.

The third lens element 630 with negative refractive power has a concave object-side surface 631 and a convex image-side surface 632. The third lens element 630 is made of plastic material and has the object-side surface 631 and the image-side surface 632 being both aspheric. Furthermore, the object-side surface 631 and the image-side surface 632 of the third lens element 630 both have at least one inflection point.

The fourth lens element 640 with positive refractive power has a concave object-side surface 641 and a convex image-side surface 642. The fourth lens element 640 is made of plastic material and has the object-side surface 641 and the image-side surface 642 being both aspheric.

The fifth lens element 650 with negative refractive power has a concave object-side surface 651 and a concave image-side surface 652. The fifth lens element 650 is made of plastic material and has the object-side surface 651 and the image-side surface 652 being both aspheric. Furthermore, the object-side surface 651 and the image-side surface 652 of the fifth lens element 650 both have at least one inflection point. The refractive power of the fifth lens element 650 decreases from a paraxial region to an off-axis region thereof.

Moreover, the refractive power of the first lens element 610 is stronger than the refractive power of the second lens element 620, the third lens element 630, the fourth lens element 640 and the fifth lens element 650.

The IR-cut filter 660 is made of glass material and located between the fifth lens element 650 and the image surface 670, and will not affect a focal length of the photographing optical lens assembly.

The detailed optical data of the 6th embodiment are shown in Table 11 and the aspheric surface data are shown in Table 12 below.

TABLE 11

6th Embodiment
f = 5.52 mm, Fno = 2.84, HFOV = 23.1 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Ape. Stop | Plano | | −0.337 | | | | |
| 2 | Lens 1 | 1.547 | ASP | 0.843 | Plastic | 1.544 | 65.9 | 2.43 |
| 3 | | −7.334 | ASP | 0.066 | | | | |
| 4 | Lens 2 | 5.814 | ASP | 0.240 | Plastic | 1.639 | 23.5 | −3.63 |
| 5 | | 1.632 | ASP | 0.465 | | | | |

TABLE 11-continued

6th Embodiment
f = 5.52 mm, Fno = 2.84, HFOV = 23.1 deg.

| Surface # | | Curvature Radius | | Thickness | Material | Index | Abbe # | Focal Length |
|---|---|---|---|---|---|---|---|---|
| 6 | Lens 3 | −3.215 | ASP | 0.317 | Plastic | 1.544 | 55.9 | −27.47 |
| 7 | | −4.239 | ASP | 0.952 | | | | |
| 8 | Lens 4 | −7.796 | ASP | 0.700 | Plastic | 1.639 | 23.5 | 9.96 |
| 9 | | −3.626 | ASP | 0.456 | | | | |
| 10 | Lens 5 | −19.117 | ASP | 0.312 | Plastic | 1.544 | 55.9 | −5.25 |
| 11 | | 3.376 | ASP | 0.550 | | | | |
| 12 | IR-cut filter | Plano | | 0.210 | Glass | 1.517 | 64.2 | — |
| 13 | | Plano | | 0.335 | | | | |
| 14 | Image | Plano | | — | | | | |

Note:
Reference wavelength is 587.6 nm (d-line).

TABLE 12

Aspheric Coefficients

| Surface # | 2 | 3 | 4 | 5 | 6 |
|---|---|---|---|---|---|
| k = | −2.8721E−01 | 5.8497E+00 | −6.8732E+01 | −2.7553E+00 | 4.0611E+00 |
| A4 = | 1.0184E−02 | 8.7725E−02 | 3.0147E−02 | 4.5891E−03 | 9.1563E−02 |
| A6 = | 7.8349E−03 | −1.6052E−01 | −1.5718E−01 | 1.0328E−01 | 2.8444E−03 |
| A8 = | −1.3968E−02 | 2.2236E−01 | 3.1149E−01 | −1.2642E−01 | 3.2476E−02 |
| A10 = | 1.9277E−02 | −1.6233E−01 | −2.4023E−01 | 4.6217E−01 | 2.2409E−01 |
| A12 = | −9.4085E−03 | 3.6922E−02 | 3.8693E−02 | −3.5228E−01 | −1.8834E−01 |

| Surface # | 7 | 8 | 9 | 10 | 11 |
|---|---|---|---|---|---|
| k = | 1.1725E+01 | 2.7791E+01 | −7.2530E+00 | −7.2365E+01 | −1.4295E−01 |
| A4 = | 9.8192E−02 | −6.1571E−03 | −7.3604E−04 | −1.2505E−01 | −1.7601E−01 |
| A6 = | 2.0467E−02 | −3.5932E−02 | −5.1021E−02 | 2.7240E−02 | 7.8150E−02 |
| A8 = | −5.5374E−03 | 1.1515E−02 | 3.0502E−02 | 1.4096E−02 | −2.4585E−02 |
| A10 = | 1.3219E−01 | 5.3064E−04 | −9.6341E−03 | −8.4589E−03 | 5.2912E−03 |
| A12 = | −8.3929E−02 | 7.6584E−04 | 1.4114E−03 | 1.2075E−03 | −8.1172E−04 |
| A14 = | | | | | 6.2335E−05 |

In the 6th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 6th embodiment, so an explanation in this regard will not be provided again.

Moreover, these parameters can be calculated from Table 11 and Table 12 as the following values and satisfy the following conditions:

| 6th Embodiment | | | |
|---|---|---|---|
| f (mm) | 5.52 | |f/f1| | 2.27 |
| Fno | 2.84 | |f/f2| | 1.52 |
| HFOV (deg.) | 23.1 | |f/f3| | 0.20 |
| V2 + V4 | 47.00 | |f/f4| | 0.55 |
| |R10/R9| | 0.18 | |f/f5| | 1.05 |
| f1/T34 | 2.55 | SD/TD | 0.92 |
| f12/f345 | −0.60 | f/ImgH | 2.32 |
| f/EPD | 2.84 | TL/ImgH | 2.28 |
| |f/f1| + |f/f2| | 3.79 | | |

As shown in the above table, the following relationships are satisfied: |f/f1|>|f/f2|>|f/f5|>|f/f3|; and |f/f1|>|f/f2|>|f/f5|>|f/f4|.

Furthermore, as shown in Table 11, when an axial distance between the first lens element 610 and the second lens element 620 is T12, an axial distance between the second lens element 620 and the third lens element 630 is T23, an axial distance between the third lens element 630 and the fourth lens element 640 is T34, and an axial distance between the fourth lens element 640 and the fifth lens element 650 is T45, T34 is greater than T12, T23 and T45, and the following relationship is satisfied: 0<T12<T45<T23<T34.

Moreover, as shown in Table 11, when a curvature radius of the image-side surface 622 of the second lens element 620 is R4, a curvature radius of the image-side surface 642 of the fourth lens element 640 is R8, a curvature radius of the object-side surface 651 of the fifth lens element 650 is R9, and a curvature radius of the image-side surface 652 of the fifth lens element 650 is R10, the following relationships are satisfied: |R4|<|R8|; |R4|<|R9|; and |R4|<|R10|.

7th Embodiment

Figure 13:
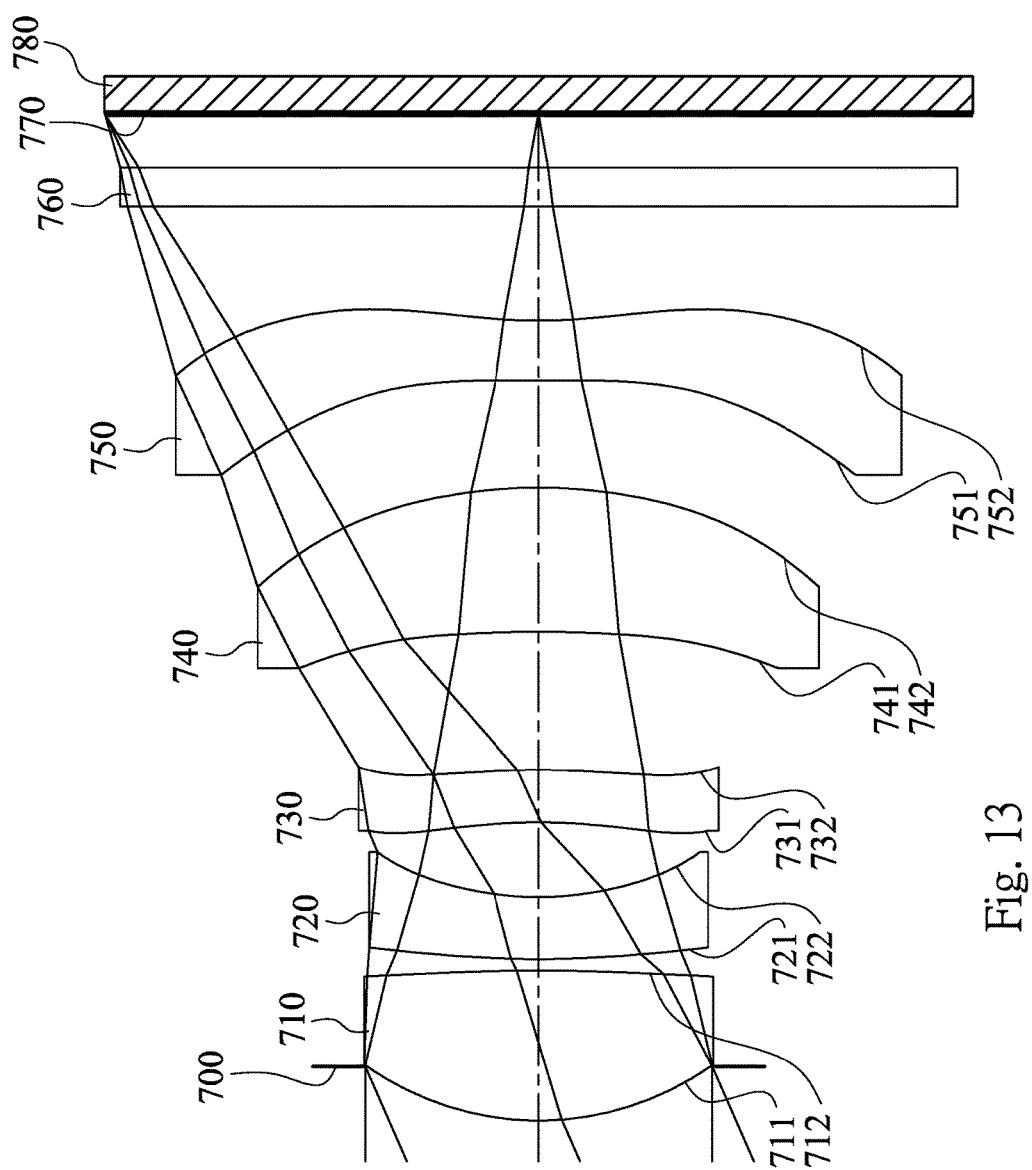
FIG. 13 is a schematic view of an image capturing device according to the 7th embodiment of the present disclosure.
Figure 14:
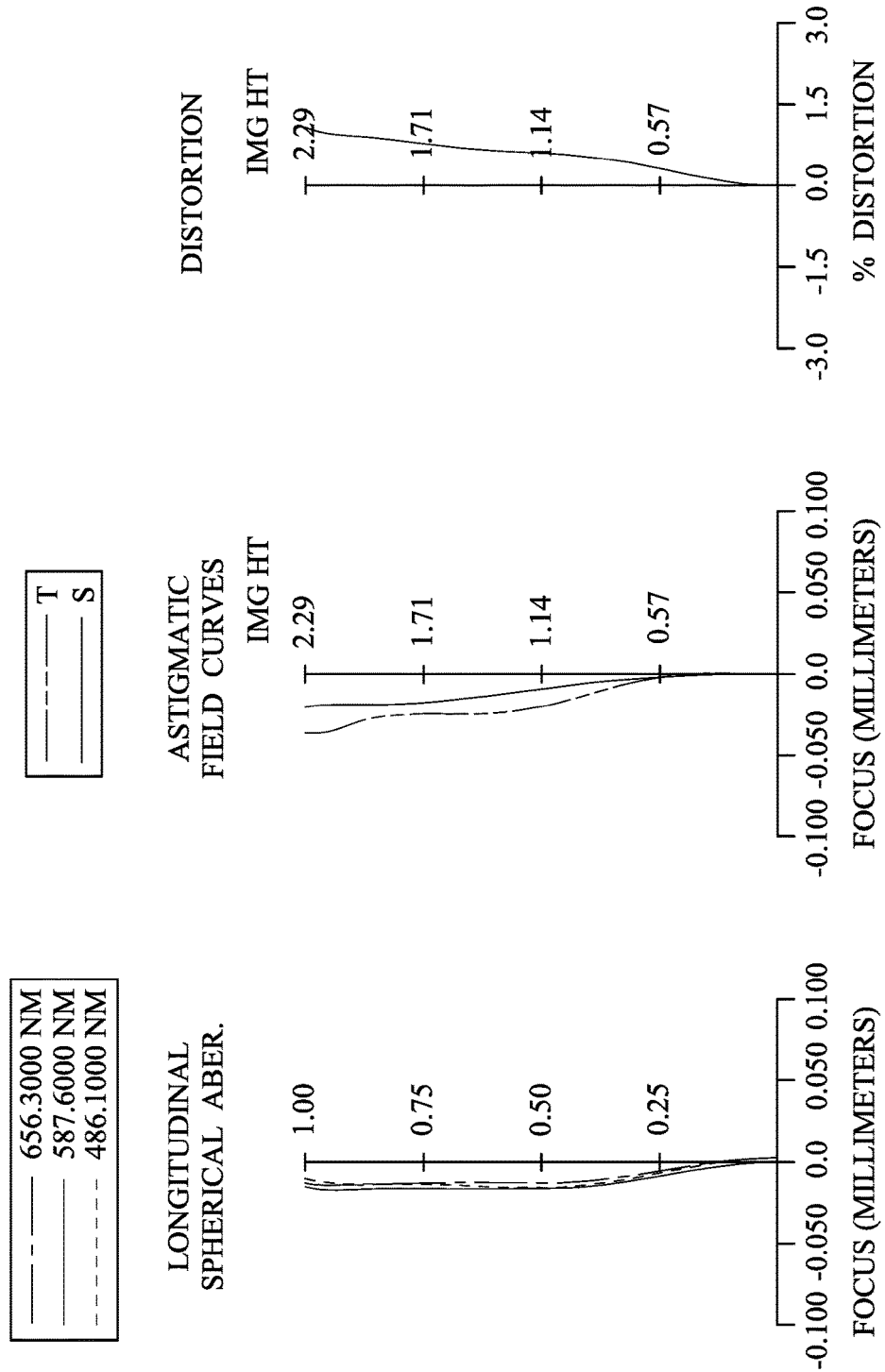
FIG. 14 shows spherical aberration curves, astigmatic field curves and a distortion curve of the image capturing device according to the 7th embodiment.

FIG. 13 is a schematic view of an image capturing device according to the 7th embodiment of the present disclosure. FIG. 14 shows spherical aberration curves, astigmatic field curves and a distortion curve of the image capturing device according to the 7th embodiment. In FIG. 13, the image capturing device includes a photographing optical lens assembly (its reference numeral is omitted) and an image sensor 780. The photographing optical lens assembly includes, in order from an object side to an image side, an aperture stop 700, a first lens element 710, a second lens element 720, a third lens element 730, a fourth lens element 740, a fifth lens element 750, an IR-cut filter 760 and an image surface 770. The image sensor 780 is disposed on the image surface 770 of the photographing optical lens assembly. The photographing optical lens assembly has a total of five lens elements (710-750) with refractive power. No relative movement is between any two of the first lens element 710, the second lens element 720, the third lens element 730, the fourth lens element 740 and the fifth lens element 750. An axial distance is between any two of the first lens element 710, the second lens element 720, the third lens element 730, the fourth lens element 740 and the fifth lens element 750 adjacent to each other.

The first lens element 710 with positive refractive power has a convex object-side surface 711 and a convex image-side surface 712. The first lens element 710 is made of plastic material and has the object-side surface 711 and the image-side surface 712 being both aspheric.

The second lens element 720 with negative refractive power has a convex object-side surface 721 and a concave image-side surface 722. The second lens element 720 is made of plastic material and has the object-side surface 721 and the image-side surface 722 being both aspheric.

The third lens element 730 with negative refractive power has a concave object-side surface 731 and a convex image-side surface 732. The third lens element 730 is made of plastic material and has the object-side surface 731 and the image-side surface 732 being both aspheric. Furthermore, the object-side surface 731 and the image-side surface 732 of the third lens element 730 both have at least one inflection point.

The fourth lens element 740 with positive refractive power has a concave object-side surface 741 and a convex image-side surface 742. The fourth lens element 740 is made of plastic material and has the object-side surface 741 and the image-side surface 742 being both aspheric.

The fifth lens element 750 with negative refractive power has a concave object-side surface 751 and a concave image-side surface 752. The fifth lens element 750 is made of plastic material and has the object-side surface 751 and the image-side surface 752 being both aspheric. Furthermore, the object-side surface 751 and the image-side surface 752 of the fifth lens element 750 both have at least one inflection point. The refractive power of the fifth lens element 750 decreases from a paraxial region to an off-axis region thereof.

Moreover, the refractive power of the first lens element 710 is stronger than the refractive power of the second lens element 720, the third lens element 730, the fourth lens element 740 and the fifth lens element 750.

The IR-cut filter 760 is made of glass material and located between the fifth lens element 750 and the image surface 770, and will not affect a focal length of the photographing optical lens assembly.

The detailed optical data of the 7th embodiment are shown in Table 13 and the aspheric surface data are shown in Table 14 below.

TABLE 13

7th Embodiment
f = 5.19 mm, Fno = 2.84, HFOV = 23.6 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Ape. Stop | Plano | | −0.286 | | | | |
| 2 | Lens 1 | 1.571 | ASP | 0.794 | Plastic | 1.544 | 55.9 | 2.48 |
| 3 | | −7.905 | ASP | 0.060 | | | | |
| 4 | Lens 2 | 5.577 | ASP | 0.326 | Plastic | 1.639 | 23.5 | −3.97 |
| 5 | | 1.704 | ASP | 0.394 | | | | |
| 6 | Lens 3 | −3.040 | ASP | 0.277 | Plastic | 1.640 | 23.3 | −15.41 |
| 7 | | −4.551 | ASP | 0.729 | | | | |
| 8 | Lens 4 | −7.804 | ASP | 0.760 | Plastic | 1.583 | 30.2 | 6.79 |
| 9 | | −2.722 | ASP | 0.569 | | | | |
| 10 | Lens 5 | −79.167 | ASP | 0.314 | Plastic | 1.544 | 55.9 | −4.80 |
| 11 | | 2.706 | ASP | 0.600 | | | | |
| 12 | IR-cut filter | Plano | | 0.210 | Glass | 1.517 | 64.2 | — |
| 13 | | Plano | | 0.284 | | | | |
| 14 | Image | Plano | | — | | | | |

Note:
Reference wavelength is 587.6 nm (d-line).

TABLE 14

Aspheric Coefficients

| Surface # | 2 | 3 | 4 | 5 | 6 |
|---|---|---|---|---|---|
| k = | −2.9462E−01 | 1.7833E+01 | −4.6416E+01 | −2.8097E+00 | 3.0641E+00 |
| A4 = | 9.3719E−03 | 8.3209E−02 | 3.5535E−02 | 4.6710E−03 | 9.6317E−02 |
| A6 = | 1.1123E−02 | −1.5755E−01 | −1.6121E−01 | 9.3318E−02 | 6.5120E−03 |
| A8 = | −2.2619E−02 | 2.3013E−01 | 3.1440E−01 | −1.5627E−01 | 3.2855E−02 |
| A10 = | 2.5424E−02 | −1.6511E−01 | −2.3522E−01 | 5.1091E−01 | 2.2029E−01 |
| A12 = | −1.0176E−02 | 3.9827E−02 | 4.2940E−02 | −3.5228E−01 | −1.8834E−01 |

TABLE 14-continued

| Aspheric Coefficients | | | | | |
|---|---|---|---|---|---|
| Surface # | 7 | 8 | 9 | 10 | 11 |
| k = | 1.3250E+01 | 2.8553E+01 | −3.8791E+00 | −6.0235E+00 | −1.9433E−01 |
| A4 = | 1.1259E−01 | −5.5951E−03 | −3.6569E−03 | −1.4189E−01 | −1.9242E−01 |
| A6 = | 2.5994E−02 | −3.4893E−02 | −4.8911E−02 | 2.7600E−02 | 7.8150E−02 |
| A8 = | 4.2778E−03 | 1.2480E−02 | 3.0045E−02 | 1.4647E−02 | −2.4367E−02 |
| A10 = | 1.2697E−01 | 1.6843E−03 | −1.0053E−02 | −8.3871E−03 | 5.3013E−03 |
| A12 = | −9.4198E−02 | 2.9596E−04 | 1.4852E−03 | 1.1787E−03 | −8.1399E−04 |
| A14 = | | | | | 6.1615E−05 |

In the 7th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 7th embodiment, so an explanation in this regard will not be provided again.

Moreover, these parameters can be calculated from Table 13 and Table 14 as the following values and satisfy the following conditions:

| 7th Embodiment | | | |
|---|---|---|---|
| f (mm) | 5.19 | |f/f1| | 2.09 |
| Fno | 2.84 | |f/f2| | 1.31 |
| HFOV (deg.) | 23.6 | |f/f3| | 0.34 |
| V2 + V4 | 53.70 | |f/f4| | 0.76 |
| |R10/R9| | 0.03 | |f/f5| | 1.08 |
| f1/T34 | 3.40 | SD/TD | 0.93 |
| f12/f345 | −0.53 | f/ImgH | 2.27 |
| f/EPD | 2.84 | TL/ImgH | 2.33 |
| |f/f1| + |f/f2| | 3.40 | | |

As shown in the above table, the following relationships are satisfied: |f/f1|>|f/f2|>|f/f5|>|f/f3|; and |f/f1|>|f/f2|>|f/f5|>|f/f4|.

Furthermore, as shown in Table 13, when an axial distance between the first lens element 710 and the second lens element 720 is T12, an axial distance between the second lens element 720 and the third lens element 730 is T23, an axial distance between the third lens element 730 and the fourth lens element 740 is T34, and an axial distance between the fourth lens element 740 and the fifth lens element 750 is T45, T34 is greater than T12, T23 and T45.

Moreover, as shown in Table 13, when a curvature radius of the image-side surface 722 of the second lens element 720 is R4, a curvature radius of the image-side surface 742 of the fourth lens element 740 is R8, a curvature radius of the object-side surface 751 of the fifth lens element 750 is R9, and a curvature radius of the image-side surface 752 of the fifth lens element 750 is R10, the following relationships are satisfied: |R4|<|R8|; |R4|<|R9|; and |R4|<|R10|.

8th Embodiment

Figure 15:
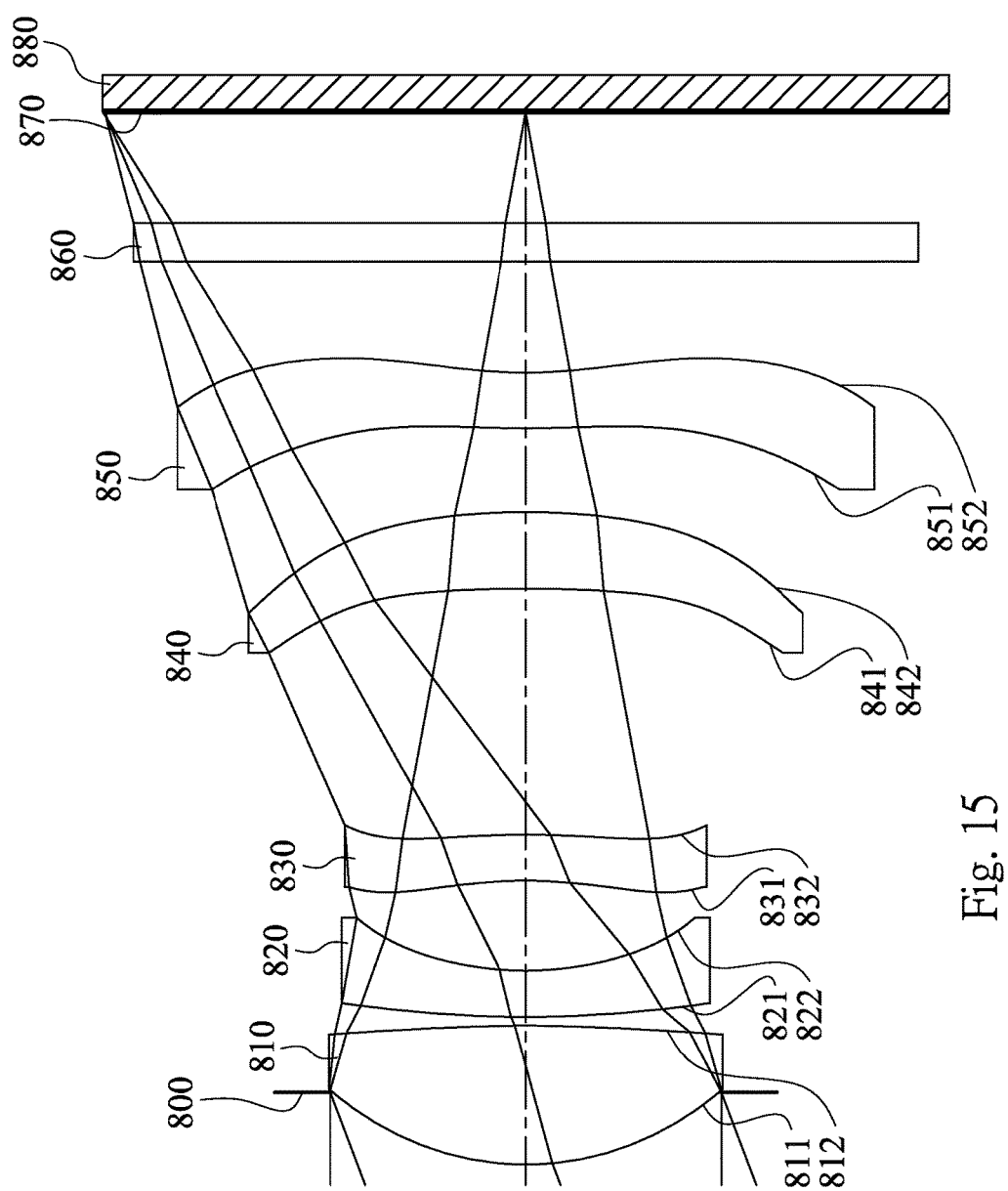
FIG. 15 is a schematic view of an image capturing device according to the 8th embodiment of the present disclosure.
Figure 16:
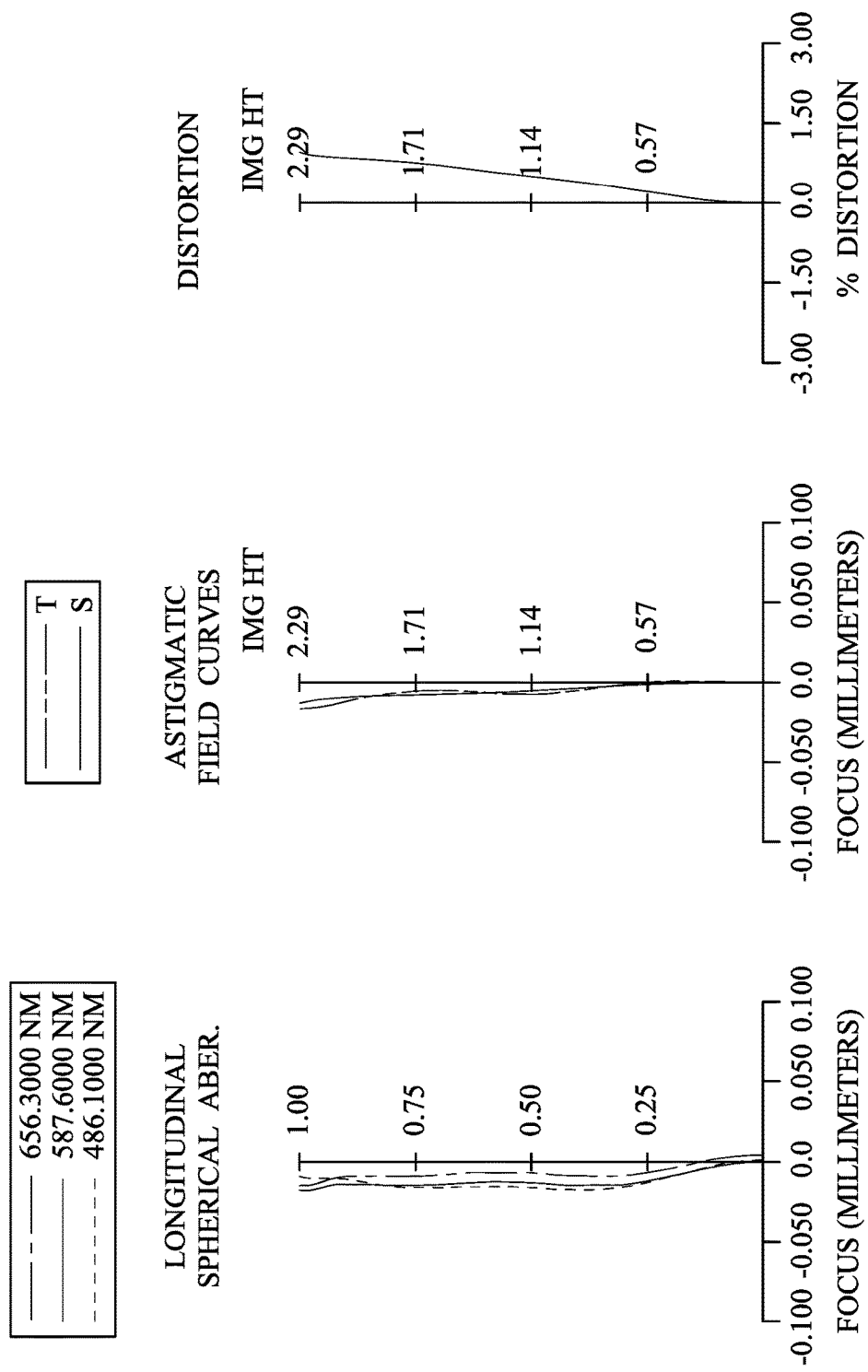
FIG. 16 shows spherical aberration curves, astigmatic field curves and a distortion curve of the image capturing device according to the 8th embodiment.

FIG. 15 is a schematic view of an image capturing device according to the 8th embodiment of the present disclosure. FIG. 16 shows spherical aberration curves, astigmatic field curves and a distortion curve of the image capturing device according to the 8th embodiment. In FIG. 15, the image capturing device includes a photographing optical lens assembly (its reference numeral is to omitted) and an image sensor 880. The photographing optical lens assembly includes, in order from an object side to an image side, an aperture stop 800, a first lens element 810, a second lens element 820, a third lens element 830, a fourth lens element 840, a fifth lens element 850, an IR-cut filter 860 and an image surface 870. The image sensor 880 is disposed on the image surface 870 of the photographing optical lens assembly. The photographing optical lens assembly has a total of five lens elements (810-850) with refractive power. No relative movement is between any two of the first lens element 810, the second lens element 820, the third lens element 830, the fourth lens element 840 and the fifth lens element 850. An axial distance is between any two of the first lens element 810, the second lens element 820, the third lens element 830, the fourth lens element 840 and the fifth lens element 850 adjacent to each other.

The first lens element 810 with positive refractive power has a convex object-side surface 811 and a convex image-side surface 812. The first lens element 810 is made of plastic material and has the object-side surface 811 and the image-side surface 812 being both aspheric.

The second lens element 820 with negative refractive power has a convex object-side surface 821 and a concave image-side surface 822. The second lens element 820 is made of plastic material and has the object-side surface 821 and the image-side surface 822 being both aspheric.

The third lens element 830 with negative refractive power has a concave object-side surface 831 and a convex image-side surface 832. The third lens element 830 is made of plastic material and has the object-side surface 831 and the image-side surface 832 being both aspheric. Furthermore, the object-side surface 831 and the image-side surface 832 of the third lens element 830 both have at least one inflection point.

The fourth lens element 840 with positive refractive power has a concave object-side surface 841 and a convex image-side surface 842. The fourth lens element 840 is made of plastic material and has the object-side surface 841 and the image-side surface 842 being both aspheric.

The fifth lens element 850 with negative refractive power has a convex object-side surface 851 and a concave image-side surface 852. The fifth lens element 850 is made of plastic material and has the object-side surface 851 and the image-side surface 852 being both aspheric. Furthermore, the object-side surface 851 and the image-side surface 852 of the fifth lens element 850 both have at least one inflection point. The refractive power of the fifth lens element 850 decreases from a paraxial region to an off-axis region thereof.

Moreover, the refractive power of the first lens element 810 is stronger than the refractive power of the second lens element 820, the third lens element 830, the fourth lens element 840 and the fifth lens element 850.

The IR-cut filter 860 is made of glass material and located between the fifth lens element 850 and the image surface 870, and will not affect a focal length of the photographing optical lens assembly.

The detailed optical data of the 8th embodiment are shown in Table 15 and the aspheric surface data are shown in Table 16 below.

TABLE 15

8th Embodiment
f = 6.01 mm, Fno = 2.84, HFOV = 20.7 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Ape. Stop | Plano | | −0.390 | | | | |
| 2 | Lens 1 | 1.576 | ASP | 0.755 | Plastic | 1.544 | 55.9 | 2.45 |
| 3 | | −7.189 | ASP | 0.047 | | | | |
| 4 | Lens 2 | 6.145 | ASP | 0.250 | Plastic | 1.639 | 23.5 | −3.91 |
| 5 | | 1.748 | ASP | 0.487 | | | | |
| 6 | Lens 3 | −2.628 | ASP | 0.250 | Plastic | 1.544 | 55.9 | −11.77 |
| 7 | | −4.606 | ASP | 1.334 | | | | |
| 8 | Lens 4 | −8.460 | ASP | 0.415 | Plastic | 1.639 | 23.5 | 10.64 |
| 9 | | −3.842 | ASP | 0.457 | | | | |
| 10 | Lens 5 | 7.092 | ASP | 0.300 | Plastic | 1.544 | 55.9 | −7.17 |
| 11 | | 2.478 | ASP | 0.600 | | | | |
| 12 | IR-cut filter | Plano | | 0.210 | Glass | 1.517 | 64.2 | — |
| 13 | | Plano | | 0.607 | | | | |
| 14 | Image | Plano | | — | | | | |

Note:
Reference wavelength is 587.6 nm (d-line).

TABLE 16

Aspheric Coefficients

| Surface # | 2 | 3 | 4 | 5 | 6 |
|---|---|---|---|---|---|
| k = | −3.4441E−01 | 1.1931E+01 | −5.3276E+01 | −2.5729E+00 | 6.2484E−07 |
| A4 = | 8.9764E−03 | 8.3640E−02 | 3.7982E−02 | 8.5777E−03 | 1.1085E−01 |
| A6 = | 1.2167E−02 | −1.6051E−01 | −1.5776E−01 | 9.0547E−02 | 1.4175E−02 |
| A8 = | −2.2948E−02 | 2.2945E−01 | 3.1342E−01 | −1.5703E−01 | 2.1246E−02 |
| A10 = | 2.4697E−02 | −1.6276E−01 | −2.3472E−01 | 5.0203E−01 | 2.1352E−01 |
| A12 = | −1.0205E−02 | 4.1145E−02 | 5.2096E−02 | −3.5029E−01 | −1.8757E−01 |

| Surface # | 7 | 8 | 9 | 10 | 11 |
|---|---|---|---|---|---|
| k = | 7.4773E+00 | 3.0296E+01 | −1.3446E+01 | −1.6711E+01 | 6.3209E−02 |
| A4 = | 1.2268E−01 | −2.4624E−02 | −3.6196E−02 | −1.3820E−01 | −1.9117E−01 |
| A6 = | 3.0800E−02 | −4.2625E−02 | −5.0774E−02 | 2.7731E−02 | 7.8150E−02 |
| A8 = | 5.7032E−04 | 1.0511E−02 | 3.0767E−02 | 1.4272E−02 | −2.4900E−02 |
| A10 = | 1.2387E−01 | 2.1431E−03 | −9.8513E−03 | −8.4474E−03 | 5.2640E−03 |
| A12 = | −9.5695E−02 | 2.5410E−04 | 1.6311E−03 | 1.1797E−03 | −8.1005E−04 |
| A14 = | | | | | 6.3812E−05 |

In the 8th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 8th embodiment, so an explanation in this regard will not be provided again.

Moreover, these parameters can be calculated from Table 15 and Table 16 as the following values and satisfy the following conditions:

| 8th Embodiment | | | |
|---|---|---|---|
| f (mm) | 6.01 | |f/f1| | 2.45 |
| Fno | 2.84 | |f/f2| | 1.54 |
| HFOV (deg.) | 20.7 | |f/f3| | 0.51 |
| V2 + V4 | 47.00 | |f/f4| | 0.56 |
| |R10/R9| | 0.35 | |f/f5| | 0.84 |
| f1/T34 | 1.84 | SD/TD | 0.91 |
| f12/f345 | −0.61 | f/ImgH | 2.63 |
| f/EPD | 2.84 | TL/ImgH | 2.50 |
| |f/f1| + |f/f2| | 3.99 | | |

As shown in the above table, the following relationships are satisfied: |f/f1|>|f2|>|f/f5|>|f/f3|; and |f/f1|>|f/f2|>|f/f5|>|f/f4|.

Furthermore, as shown in Table 15, when an axial distance between the first lens element 810 and the second lens element 820 is T12, an axial distance between the second lens element 820 and the third lens element 830 is T23, an axial distance between the third lens element 830 and the fourth lens element 840 is T34, and an axial distance between the fourth lens element 840 and the fifth lens element 850 is T45, T34 is greater than T12, T23 and T45, and the following relationship is satisfied: 0<T12<T45<T23<T34.

Moreover, as shown in Table 15, when a curvature radius of the image-side surface 822 of the second lens element 820 is R4, a curvature radius of the image-side surface 842 of the fourth lens element 840 is R8, a curvature radius of the object-side surface 851 of the fifth lens element 850 is R9, and a curvature radius of the image-side surface 852 of the fifth lens element 850 is R10, the following relationships are satisfied: |R4|<|R8|; |R4|<|R9|; and |R4|<|R10|.

9th Embodiment

Figure 17:
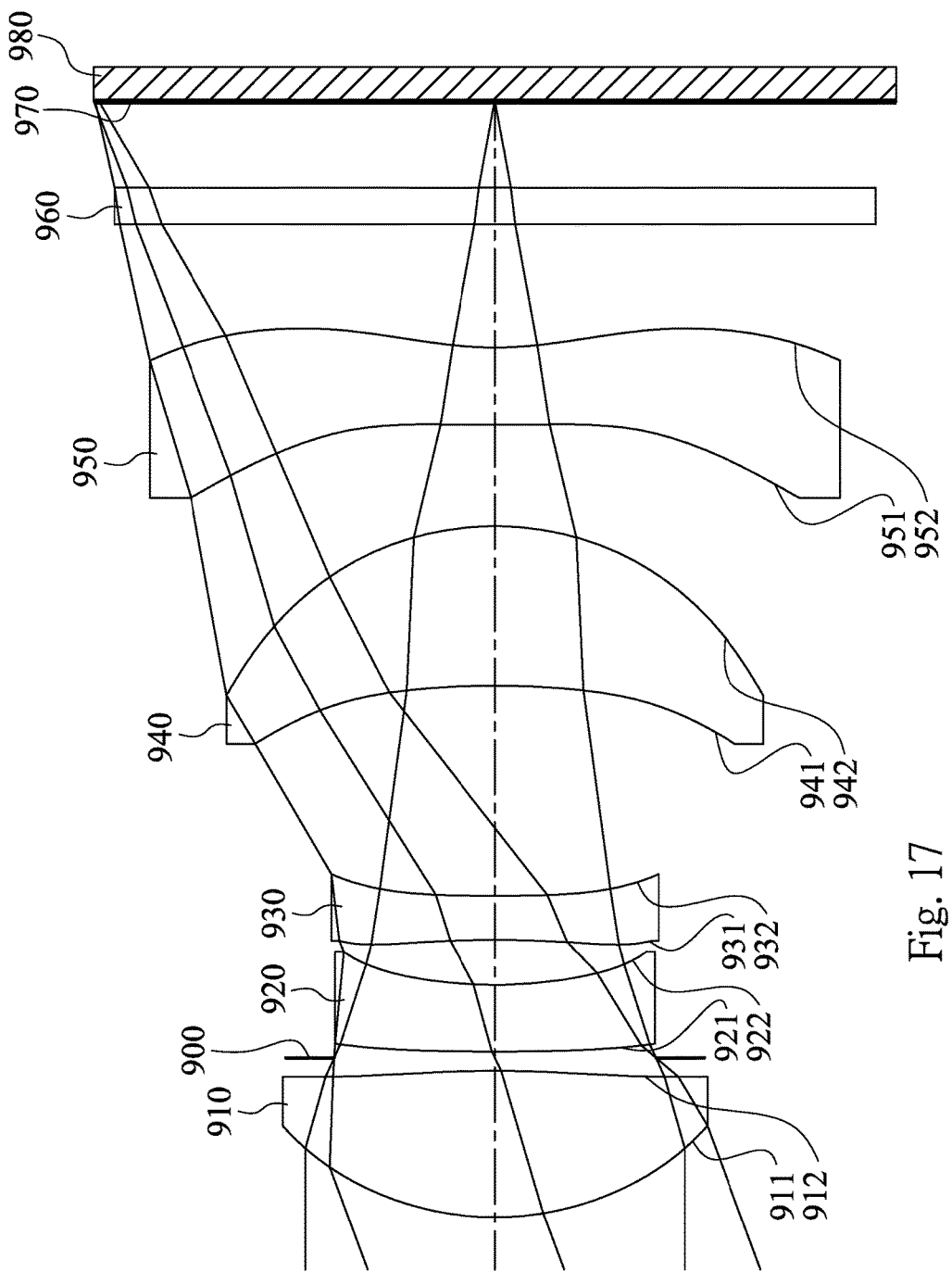
FIG. 17 is a schematic view of an image capturing device according to the 9th embodiment of the present disclosure.
Figure 18:
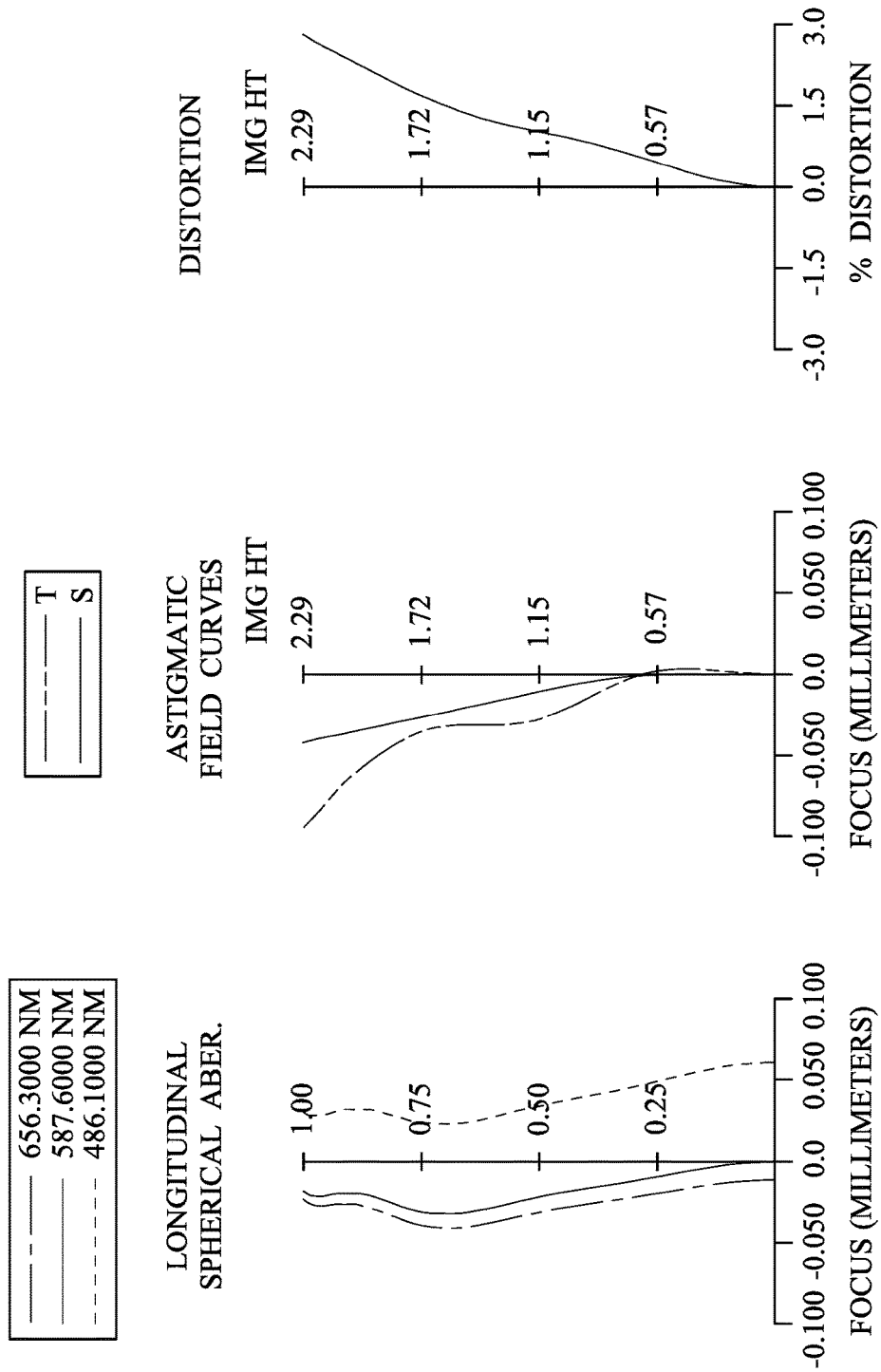
FIG. 18 shows spherical aberration curves, astigmatic field curves and a distortion curve of the image capturing device according to the 9th embodiment.

FIG. 17 is a schematic view of an image capturing device according to the 9th embodiment of the present disclosure. FIG. 18 shows spherical aberration curves, astigmatic field curves and a distortion curve of the image capturing device according to the 9th embodiment. In FIG. 17, the image capturing device includes a photographing optical lens assembly (its reference numeral is omitted) and an image sensor 980. The photographing optical lens assembly includes, in order from an object side to an image side, a first lens element 910, an aperture stop 900, a second lens element 920, a third lens element 930, a fourth lens element 940, a fifth lens element 950, an IR-cut filter 960 and an image surface 970. The image sensor 980 is disposed on the image surface 970 of the photographing optical lens assembly. The photographing optical lens assembly has a total of five lens elements (910-950) with refractive power. No relative movement is between any two of the first lens element 910, the second lens element 920, the third lens element 930, the fourth lens element 940 and the fifth lens element 950. An axial distance is between any two of the first lens element 910, the second lens element 920, the third lens element 930, the fourth lens element 940 and the fifth lens element 950 adjacent to each other.

The first lens element 910 with positive refractive power has a convex object-side surface 911 and a convex image-side surface 912. The first lens element 910 is made of plastic material and has the object-side surface 911 and the image-side surface 912 being both aspheric.

The second lens element 920 with negative refractive power has a convex object-side surface 921 and a concave image-side surface 922. The second lens element 920 is made of plastic material and has the object-side surface 921 and the image-side surface 922 being both aspheric.

The third lens element 930 with negative refractive power has a concave object-side surface 931 and a concave image-side surface 932. The third lens element 930 is made of plastic material and has the object-side surface 931 and the image-side surface 932 being both aspheric. Furthermore, the object-side surface 931 and the image-side surface 932 of the third lens element 930 both have at least one inflection point.

The fourth lens element 940 with positive refractive power has a concave object-side surface 941 and a convex image-side surface 942. The fourth lens element 940 is made of plastic material and has the object-side surface 941 and the image-side surface 942 being both aspheric.

The fifth lens element 950 with negative refractive power has a convex object-side surface 951 and a concave image-side surface 952. The fifth lens element 950 is made of plastic material and has the object-side surface 951 and the image-side surface 952 being both aspheric. Furthermore, the object-side surface 951 and the image-side surface 952 of the fifth lens element 950 both have at least one inflection point. The refractive power of the fifth lens element 950 decreases from a paraxial region to an off-axis region thereof.

Moreover, the refractive power of the first lens element 910 is stronger than the refractive power of the second lens element 920, the third lens element 930, the fourth lens element 940 and the fifth lens element 950.

The IR-cut filter 960 is made of glass material and located between the fifth lens element 950 and the image surface 970, and will not affect a focal length of the photographing optical lens assembly.

The detailed optical data of the 9th embodiment are shown in Table 17 and the aspheric surface data are shown in Table 18 below.

TABLE 17

9th Embodiment
f = 6.05 mm, Fno = 2.80, HFOV = 20.3 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Lens 1 | 1.714 | ASP | 0.833 | Plastic | 1.535 | 55.7 | 2.63 |
| 2 | | −6.484 | ASP | 0.075 | | | | |
| 3 | Ape. Stop | Plano | | 0.035 | | | | |
| 4 | Lens 2 | 15.406 | ASP | 0.380 | Plastic | 1.650 | 21.4 | −4.73 |
| 5 | | 2.539 | ASP | 0.259 | | | | |
| 6 | Lens 3 | −5.437 | ASP | 0.250 | Plastic | 1.650 | 21.4 | −5.68 |
| 7 | | 11.689 | ASP | 1.195 | | | | |
| 8 | Lens 4 | −5.089 | ASP | 0.911 | Plastic | 1.535 | 55.7 | 4.33 |
| 9 | | −1.690 | ASP | 0.575 | | | | |
| 10 | Lens 5 | 11.289 | ASP | 0.444 | Plastic | 1.535 | 55.7 | −4.94 |
| 11 | | 2.110 | ASP | 0.700 | | | | |
| 12 | IR-cut filter | Plano | | 0.210 | Glass | 1.517 | 64.2 | — |
| 13 | | Plano | | 0.492 | | | | |
| 14 | Image | Plano | | — | | | | |

Note:
Reference wavelength is 587.6 nm (d-line).

TABLE 18

Aspheric Coefficients

| Surface # | 1 | 2 | 4 | 5 | 6 |
|---|---|---|---|---|---|
| k = | −2.7605E−01 | 1.3135E+01 | −1.8636E+01 | −3.3240E+00 | 2.6897E+01 |
| A4 = | 9.5262E−03 | 8.6937E−02 | 4.3631E−02 | 3.6441E−03 | 8.4031E−02 |
| A6 = | 7.5548E−03 | −1.4717E−01 | −1.5078E−01 | 5.8889E−02 | −1.7106E−02 |
| A8 = | −1.1387E−02 | 2.2263E−01 | 3.1981E−01 | −1.3967E−01 | 4.3798E−03 |
| A10 = | 1.0479E−02 | −1.4620E−01 | −2.3587E−01 | 5.6494E−01 | 3.2081E−01 |
| A12 = | −1.4643E−03 | 3.5454E−02 | 4.9284E−02 | −3.5230E−01 | −2.2061E−01 |
| A14 = | | | | −5.9999E−05 | |

| Surface # | 7 | 8 | 9 | 10 | 11 |
|---|---|---|---|---|---|
| k = | 2.5832E+01 | 1.1060E+01 | −2.3676E−01 | 7.8666E+00 | −6.1097E−01 |
| A4 = | 9.8015E−02 | −8.4686E−03 | 8.7891E−03 | −1.5289E−01 | −1.9384E−01 |
| A6 = | 1.4764E−02 | −3.6163E−02 | −3.7728E−02 | 2.6113E−02 | 7.8150E−02 |
| A8 = | −1.9119E−02 | 1.9175E−02 | 2.5847E−02 | 1.6929E−02 | −2.4219E−02 |
| A10 = | 1.1567E−01 | −4.1671E−03 | −9.8083E−03 | −8.4995E−03 | 5.4231E−03 |
| A12 = | −1.0607E−01 | 1.5186E−03 | 1.4459E−03 | 1.1118E−03 | −8.1880E−04 |
| A14 = | | | | | 5.8683E−05 |

In the 9th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 9th embodiment, so an explanation in this regard will not be provided again.

Moreover, these parameters can be calculated from Table 17 and Table 18 as the following values and satisfy the following conditions:

| 9th Embodiment | | | |
|---|---|---|---|
| f (mm) | 6.05 | |f/f1| | 2.30 |
| Fno | 2.80 | |f/f2| | 1.28 |
| HFOV (deg.) | 20.3 | |f/f3| | 1.06 |
| V2 + V4 | 77.10 | |f/f4| | 1.40 |
| |R10/R9| | 0.19 | |f/f5| | 1.22 |
| f1/T34 | 2.20 | SD/TD | 0.82 |
| f12/f345 | −0.50 | f/ImgH | 2.65 |
| f/EPD | 2.80 | TL/ImgH | 2.78 |
| |f/f1| + |f/f2| | 3.58 | | |

Furthermore, as shown in Table 17, when an axial distance between the first lens element 910 and the second lens element 920 is T12, an axial distance between the second lens element 920 and the third lens element 930 is T23, an axial distance between the third lens element 930 and the fourth lens element 940 is T34, and an axial distance between the fourth lens element 940 and the fifth lens element 950 is T45, T34 is greater than T12, T23 and T45.

10th Embodiment

Figure 19:
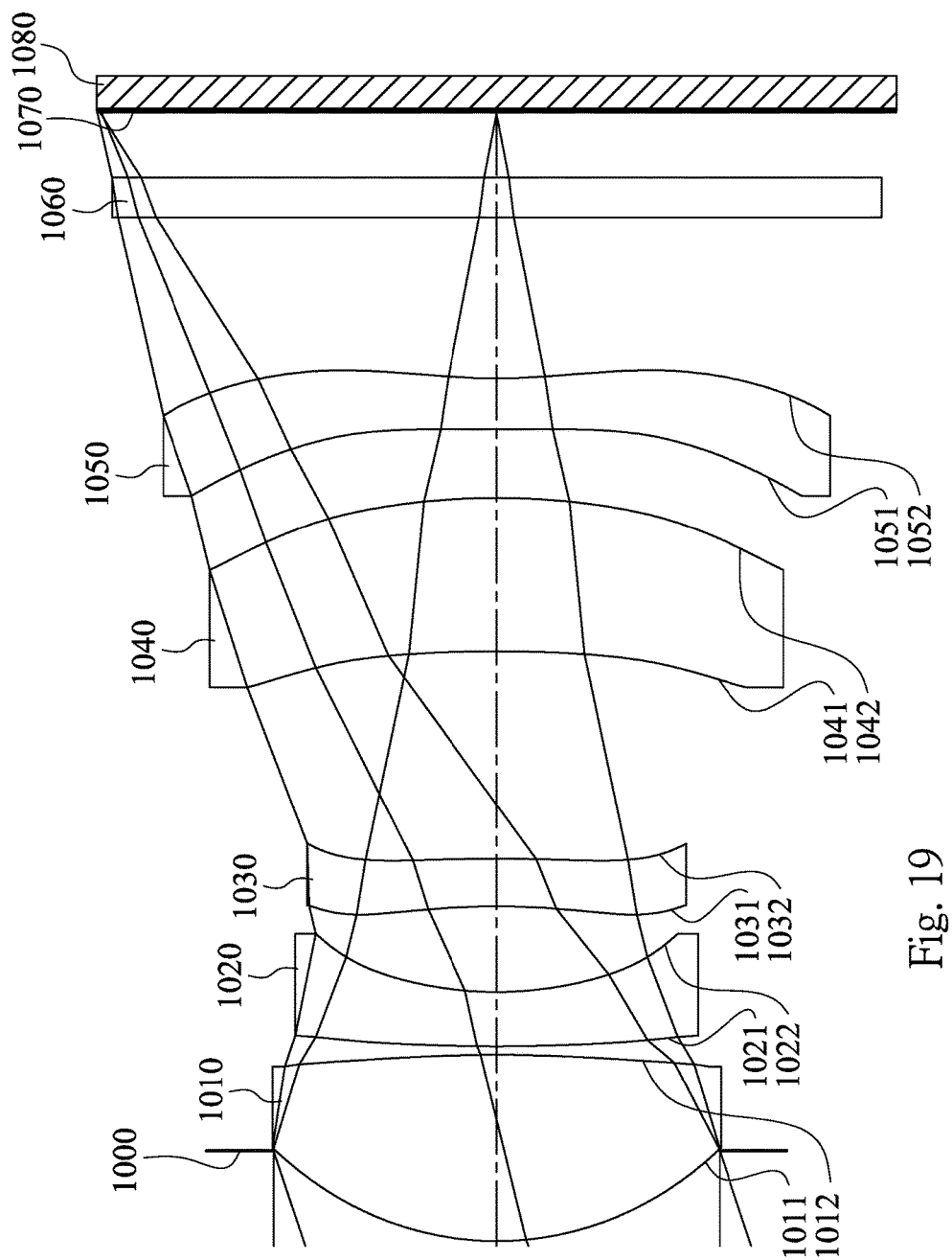
FIG. 19 is a schematic view of an image capturing device according to the 10th embodiment of the present disclosure.
Figure 20:
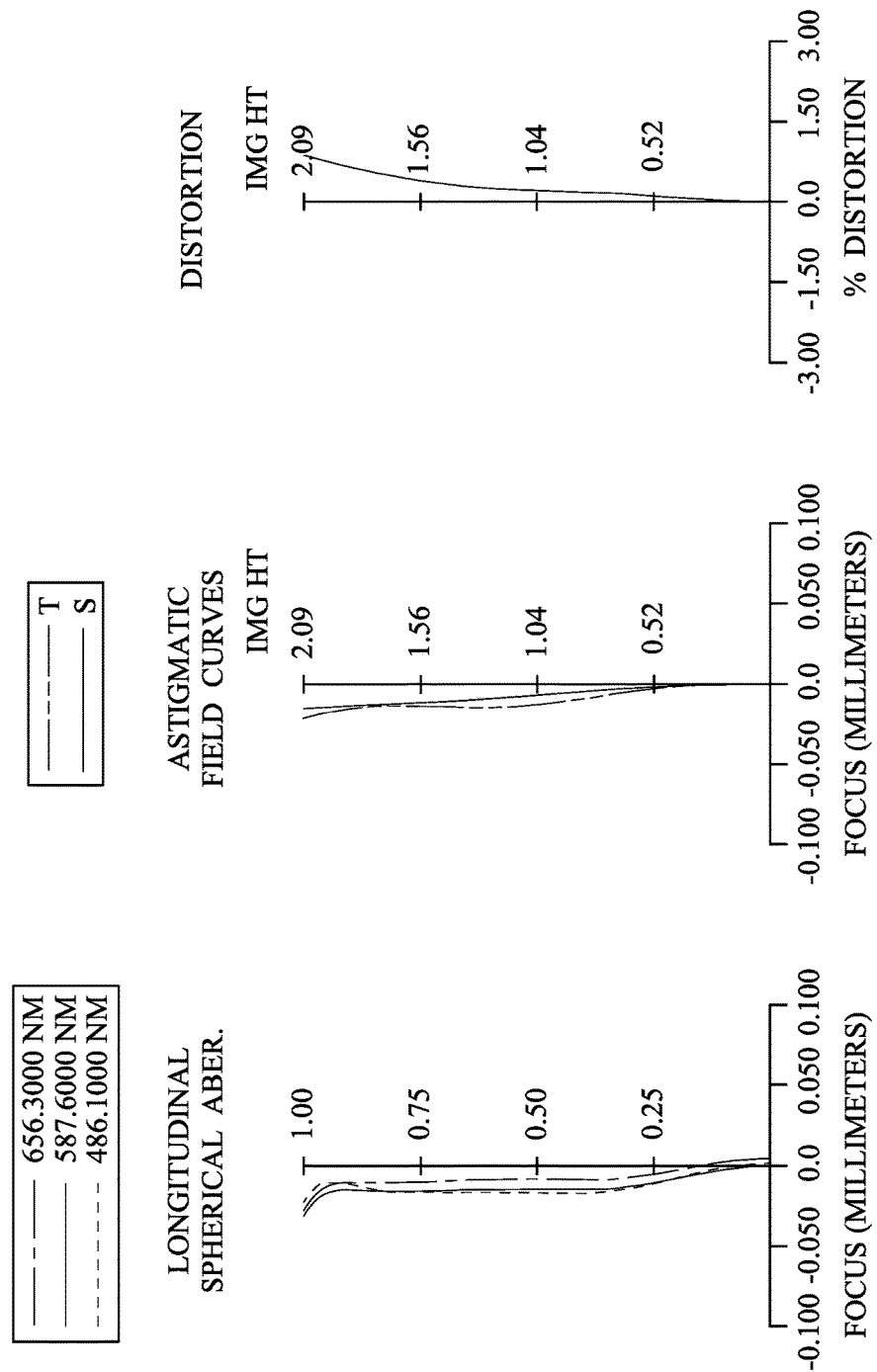
FIG. 20 shows spherical aberration curves, astigmatic field curves and a distortion curve of the image capturing device according to the 10th embodiment.

FIG. 19 is a schematic view of an image capturing device according to the 10th embodiment of the present disclosure. FIG. 20 shows spherical aberration curves, astigmatic field curves and a distortion curve of the image capturing device according to the 10th embodiment. In FIG. 19, the image capturing device includes a photographing optical lens assembly (its reference numeral is omitted) and an image sensor 1080. The photographing optical lens assembly includes, in order from an object side to an image side, an aperture stop 1000, a first lens element 1010, a second lens element 1020, a third lens element 1030, a fourth lens element 1040, a fifth lens element 1050, an IR-cut filter 1060 and an image surface 1070. The image sensor 1080 is disposed on the image surface 1070 of the photographing optical lens assembly. The photographing optical lens assembly has a total of five lens elements (1010-1050) with refractive power. No relative movement is between any two of the first lens element 1010, the second lens element 1020, the third lens element 1030, the fourth lens element 1040 and the fifth lens element 1050. An axial distance is between any two of the first lens element 1010, the second lens element 1020, the third lens element 1030, the fourth lens element 1040 and the fifth lens element 1050 adjacent to each other.

The first lens element 1010 with positive refractive power has a convex object-side surface 1011 and a convex image-side surface 1012. The first lens element 1010 is made of plastic material and has the object-side surface 1011 and the image-side surface 1012 being both aspheric.

The second lens element 1020 with negative refractive power has a convex object-side surface 1021 and a concave image-side surface 1022. The second lens element 1020 is made of plastic material and has the object-side surface 1021 and the image-side surface 1022 being both aspheric.

The third lens element 1030 with negative refractive power has a concave object-side surface 1031 and a convex image-side surface 1032. The third lens element 1030 is made of plastic material and has the object-side surface 1031 and the image-side surface 1032 being both aspheric. Furthermore, the object-side surface 1031 and the image-side surface 1032 of the third lens element 1030 both have at least one inflection point.

The fourth lens element 1040 with positive refractive power has a concave object-side surface 1041 and a convex image-side surface 1042. The fourth lens element 1040 is made of plastic material and has the object-side surface 1041 and the image-side surface 1042 being both aspheric.

The fifth lens element 1050 with negative refractive power has a convex object-side surface 1051 and a concave image-side surface 1052. The fifth lens element 1050 is made of plastic material and has the object-side surface 1051 and the image-side surface 1052 being both aspheric. Furthermore, the object-side surface 1051 and the image-side surface 1052 of the fifth lens element 1050 both have at least one inflection point. The refractive power of the fifth lens element 1050 decreases from a paraxial region to an off-axis region thereof.

Moreover, the refractive power of the first lens element 1010 is stronger than the refractive power of the second lens element 1020, the third lens element 1030, the fourth lens element 1040 and the fifth lens element 1050.

The IR-cut filter 1060 is made of glass material and located between the fifth lens element 1050 and the image surface 1070, and will not affect a focal length of the photographing optical lens assembly.

The detailed optical data of the 10th embodiment are shown in Table 19 and the aspheric surface data are shown in Table 20 below.

| 10th Embodiment | | | |
|---|---|---|---|
| f (mm) | 6.22 | $|f/f1|$ | 2.47 |
| Fno | 2.65 | $|f/f2|$ | 1.63 |
| HFOV (deg.) | 18.4 | $|f/f3|$ | 0.50 |
| V2 + V4 | 47.00 | $|f/f4|$ | 0.57 |
| $|R10/R9|$ | 0.15 | $|f/f5|$ | 0.87 |
| f1/T34 | 2.30 | SD/TD | 0.90 |
| f12/f345 | −0.63 | f/ImgH | 2.98 |
| f/EPD | 2.65 | TL/ImgH | 2.86 |
| $|f/f1| + |f/f2|$ | 4.10 | | |

TABLE 19

10th Embodiment
f = 6.22 mm, Fno = 2.65, HFOV = 18.4 deg.

| Surface # | | Curvature Radius | | Thickness | Material | Index | Abbe # | Focal Length |
|---|---|---|---|---|---|---|---|---|
| 0 | Object | Plano | | Infinity | | | | |
| 1 | Ape. Stop | Plano | | −0.475 | | | | |
| 2 | Lens 1 | 1.633 | ASP | 0.983 | Plastic | 1.544 | 55.9 | 2.52 |
| 3 | | −6.659 | ASP | 0.044 | | | | |
| 4 | Lens 2 | 9.666 | ASP | 0.286 | Plastic | 1.639 | 23.5 | −3.83 |
| 5 | | 1.929 | ASP | 0.451 | | | | |
| 6 | Lens 3 | −3.513 | ASP | 0.250 | Plastic | 1.535 | 55.7 | −12.33 |
| 7 | | −7.704 | ASP | 1.093 | | | | |
| 8 | Lens 4 | −7.775 | ASP | 0.809 | Plastic | 1.639 | 23.5 | 10.82 |
| 9 | | −3.809 | ASP | 0.360 | | | | |
| 10 | Lens 5 | 21.387 | ASP | 0.269 | Plastic | 1.544 | 55.9 | −7.13 |
| 11 | | 3.270 | ASP | 0.848 | | | | |
| 12 | IR-cut filter | Plano | | 0.210 | Glass | 1.517 | 64.2 | — |
| 13 | | Plano | | 0.353 | | | | |
| 14 | Image | Plano | | — | | | | |

Note:
Reference wavelength is 587.6 nm (d-line).

TABLE 20

Aspheric Coefficients

| Surface # | 2 | 3 | 4 | 5 | 6 |
|---|---|---|---|---|---|
| k = | −3.6451E−01 | 1.3624E+01 | −7.8915E+01 | −2.5411E+00 | 3.3942E+00 |
| A4 = | 6.6533E−03 | 8.4167E−02 | 3.3365E−02 | 1.2273E−02 | 9.9950E−02 |
| A6 = | 1.5087E−02 | −1.6022E−01 | −1.5817E−01 | 9.5687E−02 | −6.8569E−03 |
| A8 = | −2.5467E−02 | 2.3255E−01 | 3.1837E−01 | −1.9993E−01 | 2.3802E−02 |
| A10 = | 2.2322E−02 | −1.5989E−01 | −2.3566E−01 | 5.5769E−01 | 2.3318E−01 |
| A12 = | −7.1768E−03 | 3.8259E−02 | 5.1882E−02 | −3.5707E−01 | −1.8477E−01 |

| Surface # | 7 | 8 | 9 | 10 | 11 |
|---|---|---|---|---|---|
| k = | 2.7878E+01 | 2.7164E+01 | −5.4928E+00 | 8.9842E+01 | 1.2293E−01 |
| A4 = | 1.0303E−01 | −1.1456E−02 | −6.1220E−04 | −1.3540E−01 | −1.8138E−01 |
| A6 = | 1.3117E−02 | −2.7287E−02 | −4.7179E−02 | 2.5257E−02 | 7.8150E−02 |
| A8 = | −9.4318E−04 | 1.2633E−02 | 3.1034E−02 | 1.4448E−02 | −2.4530E−02 |
| A10 = | 1.3485E−01 | 1.2417E−03 | −9.9029E−03 | −8.3130E−03 | 5.2421E−03 |
| A12 = | −9.3960E−02 | 2.9310E−04 | 1.5065E−03 | 1.2088E−03 | −8.1447E−04 |
| A14 = | | | | | 6.6160E−05 |

In the 10th embodiment, the equation of the aspheric surface profiles of the aforementioned lens elements is the same as the equation of the 1st embodiment. Also, the definitions of these parameters shown in the following table are the same as those stated in the 1st embodiment with corresponding values for the 10th embodiment, so an explanation in this regard will not be provided again.

Moreover, these parameters can be calculated from Table 19 and Table 20 as the following values and satisfy the following conditions:

As shown in the above table, the following relationships are satisfied: $|f/f1|>|f/f2|>|f/f5|>|f/f3|$; and $|f/f1|>|f/f2|>|f/f5|>|f/f4|$.

Furthermore, as shown in Table 19, when an axial distance between the first lens element 1010 and the second lens element 1020 is T12, an axial distance between the second lens element 1020 and the third lens element 1030 is T23, an axial distance between the third lens element 1030 and the fourth lens element 1040 is T34, and an axial distance between the fourth lens element 1040 and the fifth lens element 1050 is T45, T34 is greater than T12, T23 and T45, and the following relationship is satisfied: 0<T12<T45<T23<T34.

Moreover, as shown in Table 19, when a curvature radius of the image-side surface 1022 of the second lens element 1020 is R4, a curvature radius of the image-side surface 1042 of the fourth lens element 1040 is R8, a curvature radius of the object-side surface 1051 of the fifth lens element 1050 is R9, and a curvature radius of the image-side surface 1052 of the fifth lens element 1050 is R10, the following relationships are satisfied: |R4|<|R8|; |R4|<|R9|; and |R4|<|R10|.

11th Embodiment

Figure 21:
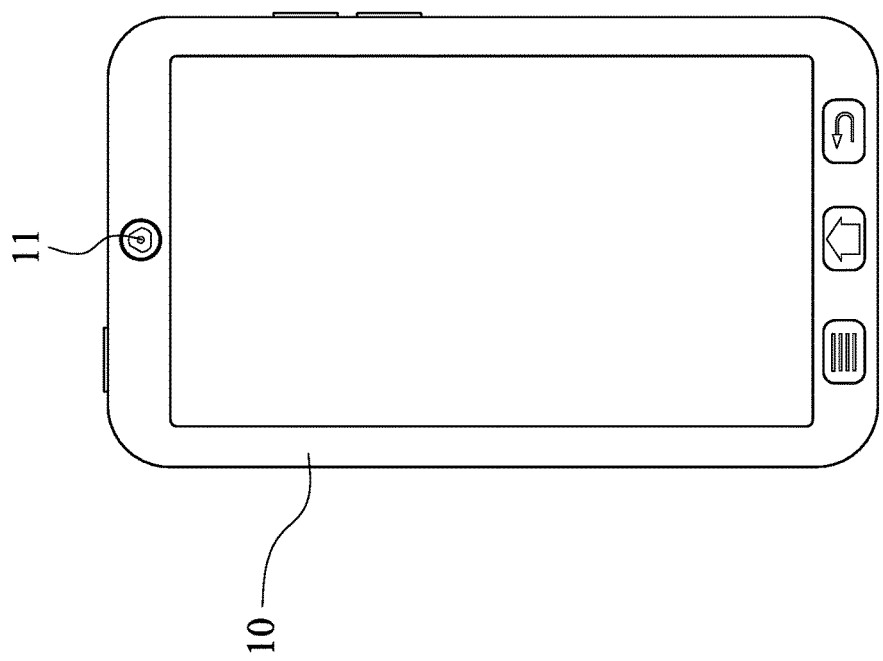
FIG. 21 is a schematic view of an electronic device according to the 11th embodiment of the present disclosure.

FIG. 21 is a schematic view of an electronic device 10 according to the 11th embodiment of the present disclosure. The electronic device 10 of the 11th embodiment is a smart phone, wherein the electronic device 10 includes an image capturing device 11. The image capturing device 11 includes a photographing optical lens assembly (not shown herein) according to the present disclosure and an image sensor (not shown herein), wherein the image sensor is disposed on or near an image surface of the photographing optical lens assembly.

12th Embodiment

Figure 22:
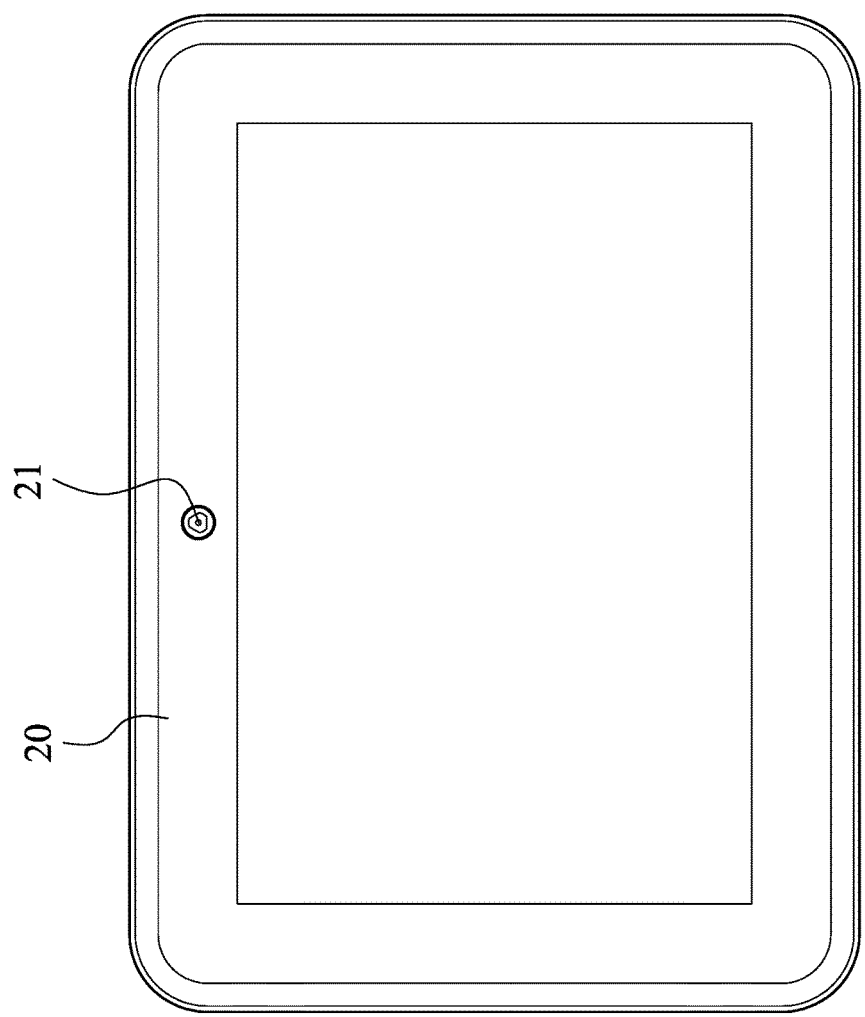
FIG. 22 is a schematic view of an electronic device according to the 12th embodiment of the present disclosure.

FIG. 22 is a schematic view of an electronic device 20 according to the 12th embodiment of the present disclosure. The electronic device 20 of the 12th embodiment is a tablet personal computer, wherein the electronic device 20 includes an image capturing device 21. The image capturing device 21 includes a photographing optical lens assembly (not shown herein) according to the present disclosure and an image sensor (not shown herein), wherein the image sensor is disposed on or near an image surface of the photographing optical lens assembly.

13th Embodiment

Figure 23:
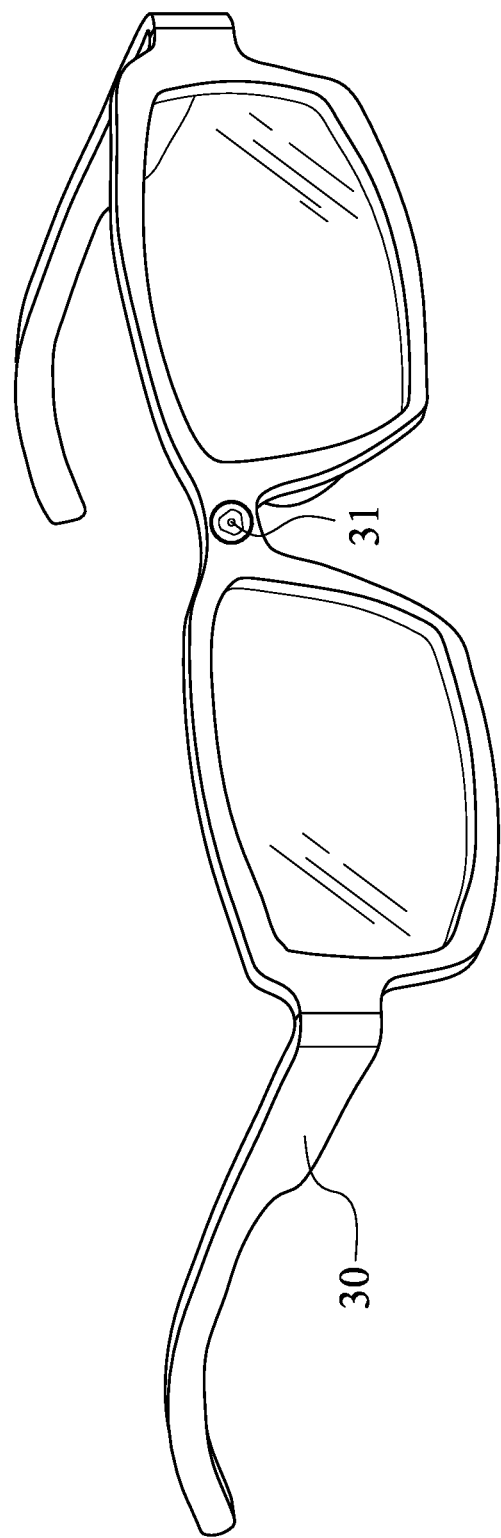
FIG. 23 is a schematic view of an electronic device according to the 13th embodiment of the present disclosure.

FIG. 23 is a schematic view of an electronic device 30 according to the 13th embodiment of the present disclosure. The electronic device 30 of the 13th embodiment is a head-mounted display, wherein the electronic device 30 includes an image capturing device 31. The image capturing device 31 includes a photographing optical lens assembly (not shown herein) according to the present disclosure and an image sensor (not shown herein), wherein the image sensor is disposed on or near an image surface of the photographing optical lens assembly.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A photographing optical lens assembly comprising five lens elements, the five lens elements being, in order from an object side to an image side:

a first lens element, a second lens element, a third lens element, a fourth lens element and a fifth lens element;

wherein each of the five lens elements has an object-side surface facing toward the object side and an image-side surface facing toward the image side;

wherein the first lens element has positive refractive power; at least one of the object-side surface and the image-side surface of the second lens element is aspheric; the image-side surface of the fifth lens element is concave in a paraxial region thereof, and at least one of the object-side surface and the image-side surface of the fifth lens element has at least one inflection point;

wherein there is an air gap in a paraxial region between every adjacent lens element of the five lens elements, a focal length of the photographing optical lens assembly is f, a focal length of the first lens element is f1, a focal length of the second lens element is f2, an axial distance between the third lens element and the fourth lens element is T34, a maximum image height of the photographing optical lens assembly is ImgH, and the following relationships are satisfied:

$0<f1/T34<2.85;$ $2.00<f/ImgH;$ and $|f/f1|>|f/f2|.$

2. The photographing optical lens assembly of claim 1, wherein the object-side surface of the second lens element is convex in a paraxial region thereof and the image-side surface of the second lens element is concave in a paraxial region thereof.

3. The photographing optical lens assembly of claim 1, wherein the image-side surface of the fourth lens element is concave in a paraxial region thereof.

4. The photographing optical lens assembly of claim 1, wherein the second lens element has negative refractive power, and at least one of the object-side surface and the image-side surface of the third lens element has at least one inflection point.

5. The photographing optical lens assembly of claim 1, wherein the focal length of the photographing optical lens assembly is f, an entrance pupil diameter of the photographing optical lens assembly is EPD, and the following relationship is satisfied:

$2.4<f/EPD<3.5.$

6. The photographing optical lens assembly of claim 1, wherein the focal length of the photographing optical lens assembly is f, the focal length of the first lens element is f1, the focal length of the second lens element is f2, and the following relationship is satisfied:

$3.0<|f/f1|+|f/f2|.$

7. The photographing optical lens assembly of claim 1, wherein the first lens element, the second lens element, the third lens element, the fourth lens element and the fifth lens element are made of plastic material; the photographing optical lens assembly further comprises an aperture stop, an axial distance between the aperture stop and the image-side surface of the fifth lens element is SD, an axial distance between the object-side surface of the first lens element and the image-side surface of the fifth lens element is TD, and the following relationship is satisfied:

$0.75<SD/TD<1.2.$

8. The photographing optical lens assembly of claim 1, wherein the axial distance between the third lens element and the fourth lens element is a maximum value of the axial distances between every adjacent lens element of the photographing optical lens assembly.

9. An image capturing device, comprising:
the photographing optical lens assembly of claim 1; and
an image sensor disposed on the image side of the photographing optical lens assembly.

10. An electronic device, comprising:
the image capturing device of claim 9.

11. A photographing optical lens assembly comprising five lens elements, the five lens elements being, in order from an object side to an image side:
a first lens element, a second lens element, a third lens element, a fourth lens element and a fifth lens element;
wherein each of the five lens elements has an object-side surface facing toward the object side and an image-side surface facing toward the image side;
wherein the first lens element has positive refractive power; at least one of the object-side surface and the image-side surface of the second lens element is aspheric; the image-side surface of the fifth lens element is concave in a paraxial region thereof, and at least one of the object-side surface and the image-side surface of the fifth lens element has at least one inflection point;
wherein there is an air gap in a paraxial region between every adjacent lens element of the five lens elements, a focal length of the photographing optical lens assembly is f, a focal length of the first lens element is f1, a focal length of the second lens element is f2, a focal length of the fifth lens element is f5, an axial distance between the third lens element and the fourth lens element is T34, and the following relationships are satisfied:

$0<f1/T34<2.85$; and $|f/f1|>|f/f2|>|f/f5|$.

12. The photographing optical lens assembly of claim 11, wherein the object-side surface of the second lens element is concave in a paraxial region thereof.

13. The photographing optical lens assembly of claim 11, wherein the image-side surface of the third lens element is concave in a paraxial region thereof.

14. The photographing optical lens assembly of claim 11, wherein the object-side surface of the fifth lens element is convex in a paraxial region thereof, each of the object-side surface and the image-side surface of the fifth lens element has at least one inflection point.

15. The photographing optical lens assembly of claim 11, wherein the focal length of the photographing optical lens assembly is f, an entrance pupil diameter of the photographing optical lens assembly is EPD, and the following relationship is satisfied:
$2.4<f/EPD<3.5$.

16. The photographing optical lens assembly of claim 11, wherein a curvature radius of the object-side surface of the fifth lens element is R9, a curvature radius of the image-side surface of the fifth lens element is R10, and the following relationship is satisfied:

$|R10/R9|<3$.

17. The photographing optical lens assembly of claim 11, further comprising:
an aperture stop, wherein half of a maximal field of view of the photographing optical lens assembly is HFOV, an axial distance between the aperture stop and the image-side surface of the fifth lens element is SD, an axial distance between the object-side surface of the first lens element and the image-side surface of the fifth lens element is TD, and the following relationships are satisfied:

HFOV<25 degrees; and $0.75<SD/TD<1.2$.

18. The photographing optical lens assembly of claim 11, wherein the refractive power of the first lens element is stronger than a refractive power of each of the second lens element, the third lens element, the fourth lens element and the fifth lens element.

19. A photographing optical lens assembly comprising five lens elements, the five lens elements being, in order from an object side to an image side:
a first lens element, a second lens element, a third lens element, a fourth lens element and a fifth lens element;
wherein each of the five lens elements has an object-side surface facing toward the object side and an image-side surface facing toward the image side;
wherein the first lens element has positive refractive power; the second lens element has negative refractive power; the image-side surface of the fifth lens element is concave in a paraxial region thereof, and at least one of the object-side surface and the image-side surface of the fifth lens element has at least one inflection point;
wherein the refractive power of the first lens element is stronger than the refractive power of each of the second lens element, the third lens element, the fourth lens element and the fifth lens element, a focal length of the first lens element is f1, an axial distance between the third lens element and the fourth lens element is T34, an axial distance between the object-side surface of the first lens element and an image surface is TL, a maximum image height of the photographing optical lens assembly is ImgH, and the following relationships are satisfied:

$0<f1/T34<2.85$; and $2.0<TL/ImgH<3.0$.

20. The photographing optical lens assembly of claim 19, wherein the image-side surface of the third lens element is concave in a paraxial region thereof.

21. The photographing optical lens assembly of claim 19, wherein the object-side surface of the fifth lens element is convex in a paraxial region thereof, and the first lens element, the second lens element, the third lens element, the fourth lens element and the fifth lens element are made of plastic material.

22. The photographing optical lens assembly of claim 19, wherein a focal length of the photographing optical lens assembly is f, an entrance pupil diameter of the photographing optical lens assembly is EPD, and the following relationship is satisfied:

$2.4<f/EPD<3.5$.

23. The photographing optical lens assembly of claim 19, wherein a curvature radius of the object-side surface of the fifth lens element is R9, a curvature radius of the image-side surface of the fifth lens element is R10, and the following relationship is satisfied:

$|R10/R9|<3$.

24. The photographing optical lens assembly of claim 19, wherein an Abbe number of the second lens element is V2, an Abbe number of the fourth lens element is V4, and the following relationship is satisfied:

$20<V2+V4<65$.

25. A photographing optical lens assembly comprising five lens elements, the five lens elements being, in order from an object side to an image side:
- a first lens element, a second lens element, a third lens element, a fourth lens element and a fifth lens element;
- wherein each of the five lens elements has an object-side surface facing toward the object side and an image-side surface facing toward the image side;
- wherein the first lens element has positive refractive power; the object-side surface the fifth lens element is convex in a paraxial region thereof, the image-side surface of the fifth lens element is concave in a paraxial region thereof, and at least one of the object-side surface and the image-side surface of the fifth lens element has at least one inflection point;
- wherein a focal length of the photographing optical lens assembly is f, a focal length of the first lens element is f1, a focal length of the second lens element is f2, an axial distance between the third lens element and the fourth lens element is T34, half of a maximal field of view of the photographing optical lens assembly is HFOV, and the following relationships are satisfied:

$0 < f1/T34 < 3.3;$ $3.0 < |f/f1| + |f/f2|;$ $|f/f1| > |f/f2|;$ and

HFOV<25 degrees.

26. The photographing optical lens assembly of claim 25, wherein the second lens element has negative refractive power, the focal length of the photographing optical lens assembly is f, a maximum image height of the photographing optical lens assembly is ImgH, and the following relationship is satisfied:

$2.00 < f/ImgH.$

27. The photographing optical lens assembly of claim 25, wherein the focal length of the photographing optical lens assembly is f, an entrance pupil diameter of the photographing optical lens assembly is EPD, half of the maximal field of view of the photographing optical lens assembly is HFOV, and the following relationships are satisfied:

$2.4 < f/EPD < 3.5;$ and

HFOV≤23.5 degrees.

28. The photographing optical lens assembly of claim 25, wherein a central thickness of the third lens element is smaller than a central thickness of the fourth lens element.

29. The photographing optical lens assembly of claim 25, wherein at least one of the object-side surface and the image-side surface of the third lens element has at least one inflection point, and there is an air gap in a paraxial region between every adjacent lens element of the five lens elements.

* * * * *